United States Patent
Watanabe et al.

(10) Patent No.: US 10,520,088 B2
(45) Date of Patent: Dec. 31, 2019

(54) METAL GASKET

(71) Applicant: NOK Corporation, Tokyo (JP)

(72) Inventors: Takeshi Watanabe, Fukushima (JP); Ryoko Saito, Fukushima (JP); Isao Tanji, Fukushima (JP); Shinya Nakaoka, Shizuoka (JP)

(73) Assignee: NOK CORPORATION, Tokyo (JP)

(*) Notice: Subject to any disclaimer, the term of this patent is extended or adjusted under 35 U.S.C. 154(b) by 0 days.

(21) Appl. No.: 15/538,640

(22) PCT Filed: Dec. 3, 2015

(86) PCT No.: PCT/JP2015/084051
§ 371 (c)(1),
(2) Date: Jun. 21, 2017

(87) PCT Pub. No.: WO2016/104100
PCT Pub. Date: Jun. 30, 2016

(65) Prior Publication Data
US 2018/0023705 A1    Jan. 25, 2018

(30) Foreign Application Priority Data

Dec. 22, 2014 (JP) .................. 2014-259523
Dec. 22, 2014 (JP) .................. 2014-259524
Dec. 22, 2014 (JP) .................. 2014-259525

(51) Int. Cl.
*F16J 15/08* (2006.01)
*F16J 15/06* (2006.01)

(52) U.S. Cl.
CPC ......... *F16J 15/064* (2013.01); *F16J 15/0818* (2013.01); *F16J 2015/0856* (2013.01); *F16J 2015/0868* (2013.01)

(58) Field of Classification Search
CPC ........ F16J 15/064; F16J 15/08; F16J 15/0818; F16J 2015/0856; F16J 2015/0868; H05K 5/06
See application file for complete search history.

(56) References Cited

U.S. PATENT DOCUMENTS 2,991,774 A * 7/1961 Rarey ............... F02F 7/006
                                                  123/195 R
3,001,518 A * 9/1961 Payne ............... F02F 7/006
                                                  123/54.7
(Continued)

FOREIGN PATENT DOCUMENTS

CN      2916873 B2    4/1999
CN    100449181 C     1/2009
(Continued)

OTHER PUBLICATIONS

International Search Report and Written Opinion for corresponding International Application No. PCT/JP2015/084051 dated Mar. 1, 2016 and English translation.
(Continued)

*Primary Examiner* — Gilbert Y Lee
(74) *Attorney, Agent, or Firm* — Pearne & Gordon LLP

(57) ABSTRACT

The present invention addresses the problem of providing: a metal gasket capable of limiting the loss of axial bolt fastening force even if a peripheral creased section is formed as an anti-saline intrusion measure; and a metal gasket, which has relatively small curved sections with a radius of curvature of not more than 20 mm on the outer edge and which is capable of limiting loss of axial bolt fastening force even when a peripheral creased section is formed over the entire perimeter of the metal gasket as an anti-saline intrusion measure. Said problem is solved by a metal gasket, which is disposed between the abutting surfaces of two members and has, on a metal base plate: bolt holes into
(Continued)

which bolts are inserted; a bead that is to the inside of the bolt holes and is for sealing between the abutting surfaces; and a peripheral creased section configured by bending the perimeter of the metal base plate in one direction so that no gap in which saline can accumulate is formed between the abutting surfaces. The peripheral creased section has areas formed by gradually changing bend length in the gasket circumferential direction so that loss of axial bolt fastening force when compressed by bolts is limited.

10 Claims, 18 Drawing Sheets

(56) References Cited

U.S. PATENT DOCUMENTS

| | | | | |
|---|---|---|---|---|
| 3,863,936 | A | * | 2/1975 | Farnam .................. F16J 15/123 |
| | | | | 277/592 |
| 5,385,354 | A | * | 1/1995 | Hagiwara ............ F16J 15/0825 |
| | | | | 277/594 |
| 7,832,736 | B2 | * | 11/2010 | Takahashi .............. F16J 15/122 |
| | | | | 277/592 |
| 8,336,889 | B2 | * | 12/2012 | Unseld ................. F16J 15/0818 |
| | | | | 277/593 |
| 8,567,790 | B2 | * | 10/2013 | Kameyama .......... F16J 15/0825 |
| | | | | 277/594 |
| 8,757,634 | B2 | * | 6/2014 | Egloff .................. F16J 15/0825 |
| | | | | 277/594 |
| 2003/0230858 | A1 | | 12/2003 | Matsuki et al. |
| 2004/0130102 | A1 | | 7/2004 | Ueta et al. |
| 2004/0155412 | A1 | | 8/2004 | Ueta et al. |
| 2004/0164497 | A1 | | 8/2004 | Ueta et al. |
| 2005/0187331 | A1 | | 8/2005 | Yuan et al. |
| 2006/0163817 | A1 | | 7/2006 | Ishikawa et al. |
| 2008/0023923 | A1 | | 1/2008 | Kameyama et al. |
| 2009/0273143 | A1 | | 11/2009 | Nagawa et al. |
| 2012/0153579 | A1 | | 6/2012 | Nakaoka et al. |
| 2015/0211637 | A1 | | 7/2015 | Aihara et al. |

FOREIGN PATENT DOCUMENTS

| | | |
|---|---|---|
| CN | 101529138 A | 9/2009 |
| CN | 102575771 A | 7/2012 |
| EP | 0 939 209 A2 | 9/1999 |
| JP | 01-136769 U | 9/1989 |
| JP | 11-270684 A | 10/1999 |
| JP | 2001-032938 A | 2/2001 |
| JP | 4245834 B2 | 1/2009 |
| JP | 4256642 B2 | 2/2009 |
| JP | 2013-036607 A | 2/2013 |
| JP | 201361002 | 4/2013 |
| WO | 2011/024812 A1 | 3/2011 |
| WO | 2013/008511 A1 | 1/2013 |

OTHER PUBLICATIONS

First Office Action dated Jun. 4, 2018 for corresponding Chinese Application No. 201580076723.2 and English translation.
Second Office Action dated Dec. 10, 2018 for corresponding Chinese Application No. 201580076723.2 and English translation.
Extended European Search Report dated Aug. 29, 2018 for corresponding European Application No. 15872669.5.
Third Office Action dated Jun. 18, 2019 for corresponding Chinese Application No. 201580076723.2 and English translation.

* cited by examiner (a2)

(b2)

(c2)

(d2)

METAL GASKET

FIELD OF THE INVENTIONS

The present invention relates to a metal gasket, more specifically, a metal gasket that performing sealing to prevent formation of a gap in which saline accumulates between abutting surfaces of two members.

BACKGROUND OF THE INVENTIONS

Metal gaskets for automobiles may require a saline spray test as a spec evaluation item, in preparation for situations in which the automobile runs in a seaside area or in an area in a cold region in which a snow melting agent is sprinkled. For example, in the case where electronic components such as an electronic control unit (ECU), a power control unit (PCU), an inverter, and a converter are stored inside a housing formed of two members of a case member and a lid member, the above-mentioned saline spray test may be performed in a state where a metal gasket seals abutting surfaces between the case member and the lid member.

In automobile components, iron-based or aluminum-based metal is mainly used as material for two members of, for example, a case member and a lid member. In the case of performing a saline spraying test, when a counter member contacting the metal gasket is formed of an aluminum material (including aluminum alloy, the same is applicable hereinafter) such as ADC12, the sprayed saline may adhere and stay in a space between the metal gasket and the abutting surfaces, and repeat drying and wetting, to cause corrosion (space corrosion) due to saline (difference in ion concentration) in the aluminum material. The metal gasket exhibits a sealing function by reaction force of the bead made in contact with the abutting surfaces, but the sealing function is lost when the corroded section pierces through the seal line (bead contact line) of the bead.

As measures against it, the applicant of the present application has presented a metal gasket having a structure in which a bent section (hereinafter referred to as "peripheral creased section") to prevent infiltration of saline is formed over the entire perimeter of the gasket, the peripheral side of the space between the abutting surfaces is substantially filled with the peripheral creased section to reduce the space, preventing adhesion and stay of saline, and delaying loss of the sealing function due to saline (Patent Document 1).

PRIOR ART DOCUMENTS

Patent Documents

Patent Document 1: JP-A-2013-61002

SUMMARY OF THE INVENTION

Problem to be Solved by the Invention

The metal gasket disclosed in Patent Document 1 produces an advantageous effect of delaying loss of the sealing function due to saline, with the peripheral creased section, but the inventor of the present application has found the following new problem as a result of further investigation.

Specifically, because the peripheral creased section is folded with relatively short fixed length and height to substantially fill the space between the perimeter of the gasket and the abutting surfaces in which saline can stay, the metal gasket has the problem that loss of axial force (bolt fastening axial force) occurs in compression when the bolt is fastened, in particular, in the vicinity of the bolt hole.

In addition, the external shape of the metal gasket varies according to the shape of the abutting surfaces, and the metal gasket may have an external shape including a curved section that is curved in a round shape with a small radius of curvature. The conventional peripheral creased section is folded with a relatively short fixed folding width and fixed folding height over the entire perimeter, regardless of the external shape of the metal gasket. The inventor of the present application has found that the metal gasket has the problem that loss of axial force (bolt fastening axial force) occurs when the metal gasket is compressed with a bolt, in the curved section, when the metal gasket has a shape including the relatively small curved section with a radius of curvature of 20 mm or less in an outer edge thereof.

For this reason, the first problem of the present invention is to provide a metal gasket capable of suppressing loss of the bolt fastening axial force even when a peripheral creased section is formed as measures against infiltration of saline.

The second problem of the present invention is to provide a metal gasket capable of suppressing loss of the bolt fastening axial force even when a peripheral creased section is formed, as measures against infiltration of saline, over the entire perimeter of the metal gasket including a relatively small curved section with a radius of curvature of 20 mm or less in an outer edge thereof.

Other problems of the present invention are clarified by the following descriptions.

Means for Solving Problem

The above-described problems are solved by the following respective inventions.

1. A metal gasket to be disposed between abutting surfaces of two members, the metal gasket comprising:
   a metal base plate including a bolt hole through which a bolt is inserted, a bead section for sealing a space between the abutting surfaces on a more internal circumferential side than the bolt hole, and a peripheral creased section formed by folding a perimeter of the metal base plate in one direction to prevent formation of a gap in which saline accumulates between the abutting surfaces, wherein
   the peripheral creased section includes a region with a folding length gradually changing in a gasket circumferential direction to suppress loss of a bolt fastening axial force in compression with the bolt.
2. The metal gasket according to 1, wherein the peripheral creased section is not formed in vicinity of the bolt hole, but formed in the perimeter of the metal base plate except the vicinity of the bolt hole.
3. The metal gasket according to 2, wherein the folding length of the peripheral creased section is formed to gradually change in the gasket circumferential direction to become shorter toward the vicinity of the bolt hole in which the peripheral creased section is not formed.
4. The metal gasket according to 2 or 3, wherein, in the perimeter of the metal base plate in which the peripheral creased section is not formed, a recognition projection to recognize whether the gasket is attached is formed, the recognition projection extending outward and sideward from the space between the abutting surfaces.
5. The metal gasket according to 2, 3, or 4, wherein the folding length of the peripheral creased section falls within a range of 0.3 mm to 5.0 mm.

6. The metal gasket according to 1, wherein the peripheral creased section is formed over an entire perimeter of the metal base plate, and has the folding length and a folding height that are formed to gradually change in the gasket circumferential direction such that the folding length becomes longer and the folding height becomes shorter toward the bolt hole.
7. The metal gasket according to 6, wherein an end edge on an internal circumferential side of the peripheral creased section is disposed to contact the bolt hole or extend across the bolt hole.
8. The metal gasket according to 6 or 7, wherein, in the peripheral creased section in vicinity of the bolt hole, a recognition projection to recognize whether the gasket is attached, the recognition projection extending outward and sideward from the space between the abutting surfaces.
9. The metal gasket according to 1, further comprising:
   at least one curved section with a radius of curvature of 20 mm or less in an outer edge of the metal base plate, wherein
   the peripheral creased section is formed over an entire perimeter of the metal base plate, and has a folding width in vicinity of the curved section that gradually changes in the gasket circumferential direction.
10. The metal gasket according to 9, wherein the folding width of the peripheral creased section is formed to gradually change in the gasket circumferential direction such that the folding width becomes wider toward the curved section from the outer edge of the metal base plate.
11. The metal gasket according to 9 or 10, wherein the folding width of the peripheral creased section is formed to gradually change in the gasket circumferential direction such that the folding width becomes wider toward the bolt hole from the curved section of the metal base plate.
12. The metal gasket according to any one of 6 to 11, wherein the folding width of the peripheral creased section falls within a range of 0.3 mm to 30.0 mm.
13. The metal gasket according to any one of 1 to 12, wherein surfaces of the metal base plate are covered with a rubber-like elastic member.

Effect of the Invention

The present invention provides a metal gasket capable of suppressing loss of the bolt fastening axial force even when a peripheral creased section is formed as measures against infiltration of saline.

The present invention also provides a metal gasket capable of suppressing loss of the bolt fastening axial force even when a peripheral creased section is formed, as measures against infiltration of saline, over the entire perimeter of the metal gasket including a relatively small curved section with a radius of curvature of 20 mm or less in an outer edge thereof.

DETAILED DESCRIPTION OF THE INVENTIONS

Embodiments to carry out the present invention will be explained hereinafter with reference to drawings.

First Embodiment

Figure 1:
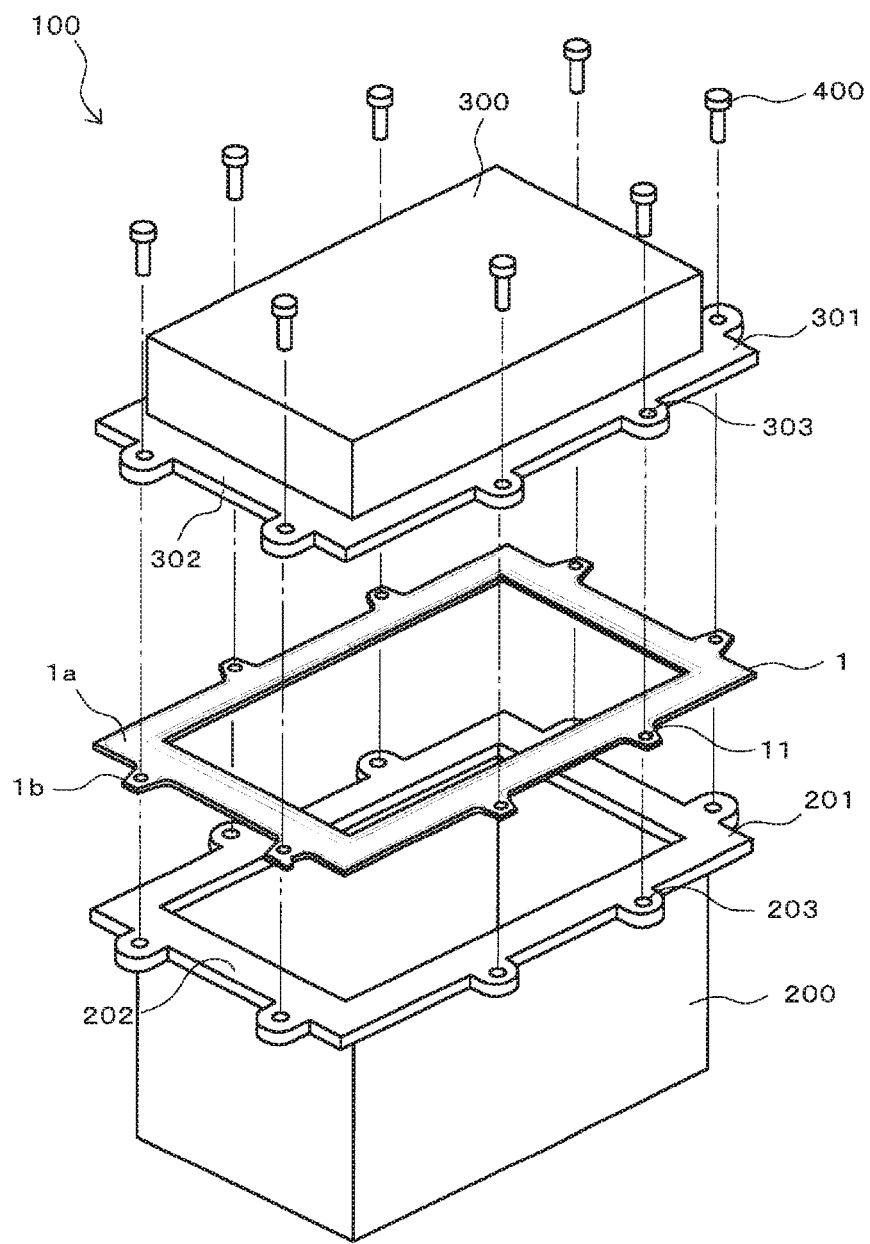
FIG. 1 is an exploded perspective view of a housing to which an example of a metal gasket according to a first embodiment of the present invention is applied.
Figure 2:
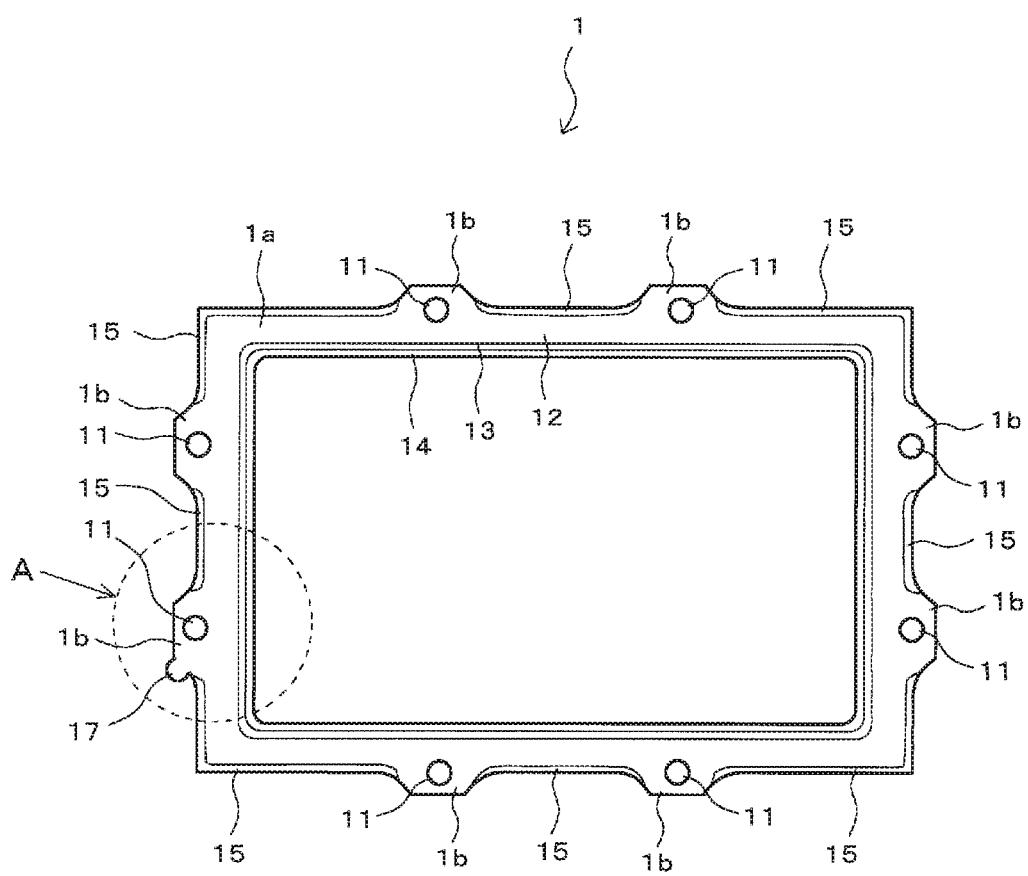
FIG. 2 is a plan view of the metal gasket illustrated in FIG. 1.
Figure 3:
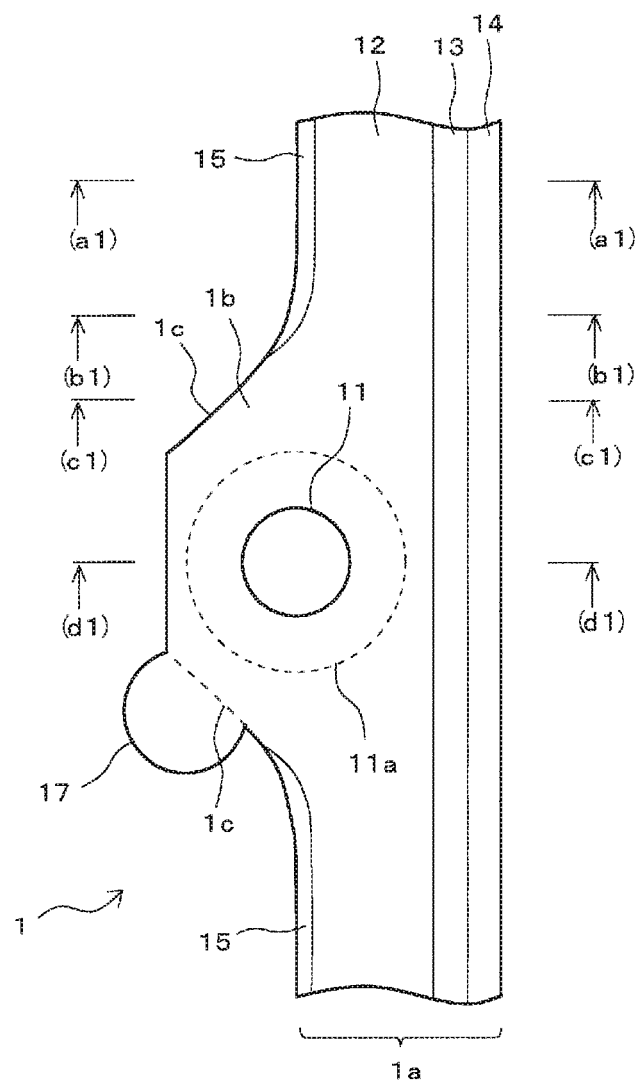
FIG. 3 is a partly enlarged plan view of a part A enclosed with a broken line in FIG. 2.

A metal gasket according to the first embodiment has a structure in which a peripheral creased section is not formed in the vicinity of the bolt hole, but formed in the perimeter of the metal base plate such that the folding length gradually changes in the gasket circumferential direction, to suppress loss of the bolt fastening axial force in compression with the bolt.
FIG. 1 is an exploded perspective view of a housing to which an example of the metal gasket according to the first embodiment is applied, FIG. 2 is a plan view of the metal gasket illustrated in FIG. 1, FIG. 3 is a partly enlarged plan view of part A enclosed with a broken line in FIG. 2, FIGS. 4(a1), 4(b1), 4(c1), and 4(d1) are end views taken along line (a1)-(a1), line (b1)-(b1), line (c1)-(c1), and line (d1)-(d1) in FIG. 3, respectively, and FIGS. 5(a1), 5(b1), 5(c1), and 5(d1) are end views at the time when the metal gasket illustrated in FIGS. 4(a1), 4(b1), 4(c1), and 4(d1) is fastened with a bolt.

The housing 100 is explained first.

The housing 100 illustrated in FIG. 1 is formed of two members of a case member 200 and a lid member 300. The case member 200 and the lid member 300 include flange sections 201 and 301, respectively, around an opening section thereof as one unitary piece. A metal gasket 1 is disposed between abutting surfaces 202 and 302 of the flange sections 201 and 301. At least one of the case member 200 and the lid member 300 of the housing 100 is formed of an aluminum material that is easily corroded with saline, but the case member 200 and the lid member 300 may be formed of other material such as iron.

The abutting surfaces 202 and 302 of the flange sections 201 and 301 are formed to surround the perimeters of the respective opening sections of the case member 200 and the lid member 300 like bands of a fixed width. Sections in which bolt holes 203 and 303 are formed partly project sideward.

The metal gasket 1 includes an annular section 1a and projecting sections 1b, as illustrated in FIG. 2 and FIG. 3. The annular section 1a is formed with a fixed width similar to the abutting surfaces 202 and 302 of the respective flange sections 201 and 301 of the case member 200 and the lid member 300. The projecting sections 1b are located in positions corresponding to the respective bolt holes 203 and 303 of the flange sections 201 and 301, and partly project sideward from the annular section 1a to be connected therewith with a smooth curve. Each of the projecting sections 1b is provided with a bolt hole 11 corresponding to the bolt holes 203 and 303 of the flange sections 201 and 301.

In the housing 100, the case member 200, the lid member 300, and the metal gasket 1 are fastened in one unitary piece with bolts 400 inserted through the bolt holes 203, 303, and 11. The metal gasket 1 held between the flange sections 201 and 301 seals the abutting surfaces 202 and 302 of the flange sections 201 and 301.

The following is explanation of the metal gasket 1.

Figure 4:
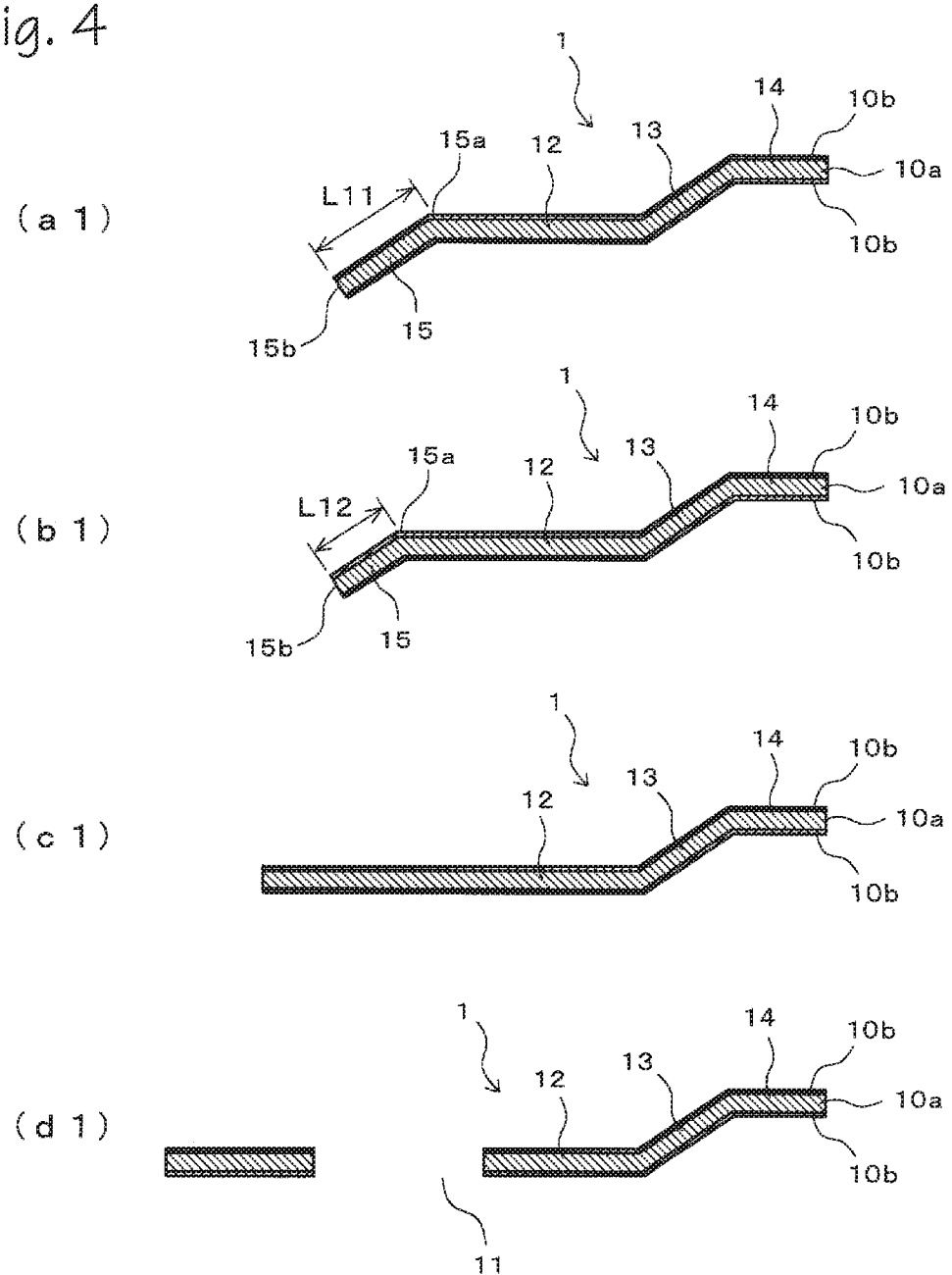
FIGS. 4($a1$), 4($b1$), 4($c1$), and 4($d1$) are end views taken along line (a1)-(a1), line (b1)-(b1), line (c1)-(c1), and line (d1)-(d1) in FIG. 3, respectively.

As illustrated in FIG. 4, the metal gasket 1 according to the first embodiment has a layered structure in which surfaces (front and rear surfaces) of the metal base plate 10a are covered with rubber-like elastic members 10b. This is a preferable form in the first embodiment. The rubber-like elastic members 10b on the surfaces elastically and closely contact the abutting surfaces 202 and 302, to enhance the sealing properties, and exert the effect of preventing the metal gasket 1 from corroding by saline adhering thereto.

Examples of the metal base plate 10a include a stainless steel sheet, a cold-rolled steel sheet, a galvanized steel sheet, and an aluminum composite sheet. Examples of the rubber-like elastic member 10b include nitrile rubber, styrene butadiene rubber, fluororubber, acryl rubber, and silicon rubber. The rubber-like elastic rubber 10b may be one of these types of rubber, or synthetic rubber (including foam rubber) containing two or more of these types of rubber.

Surface preparation layers (not illustrated) are preferably formed on the surfaces of the metal base plate 10a to improve adhesiveness to the rubber-like elastic members 10b.

The metal gasket 1 is formed by bending the metal base plate 10a to have a shape including a first flat section 12, a half bead section 13, and a second flat section 14. The half bead section 13 is formed to slant toward one of the thickness direction (the upward direction in FIG. 4) of the metal base plate 10a in the internal circumferential section (right end section in FIG. 4) of the first flat section 12. The second flat section 14 is formed in the more internal circumferential section than the half bead section 13 and in substantially parallel to the first flat section 12.

The bolt holes 11 are disposed in the respective projecting sections 1b formed of the first flat section 12 projecting sideward. The half bead section 13 and the second flat section 14 are disposed on more internal circumferential side than the bolt holes 11. As illustrated in FIGS. 4(a1) and 4(b1), the perimeter (the left end section in FIG. 4) of the first flat section 12 is provided with a peripheral creased section 15 that is folded toward the other of the thickness direction (downward direction in FIG. 4) of the metal base plate 10a.

Figure 5:
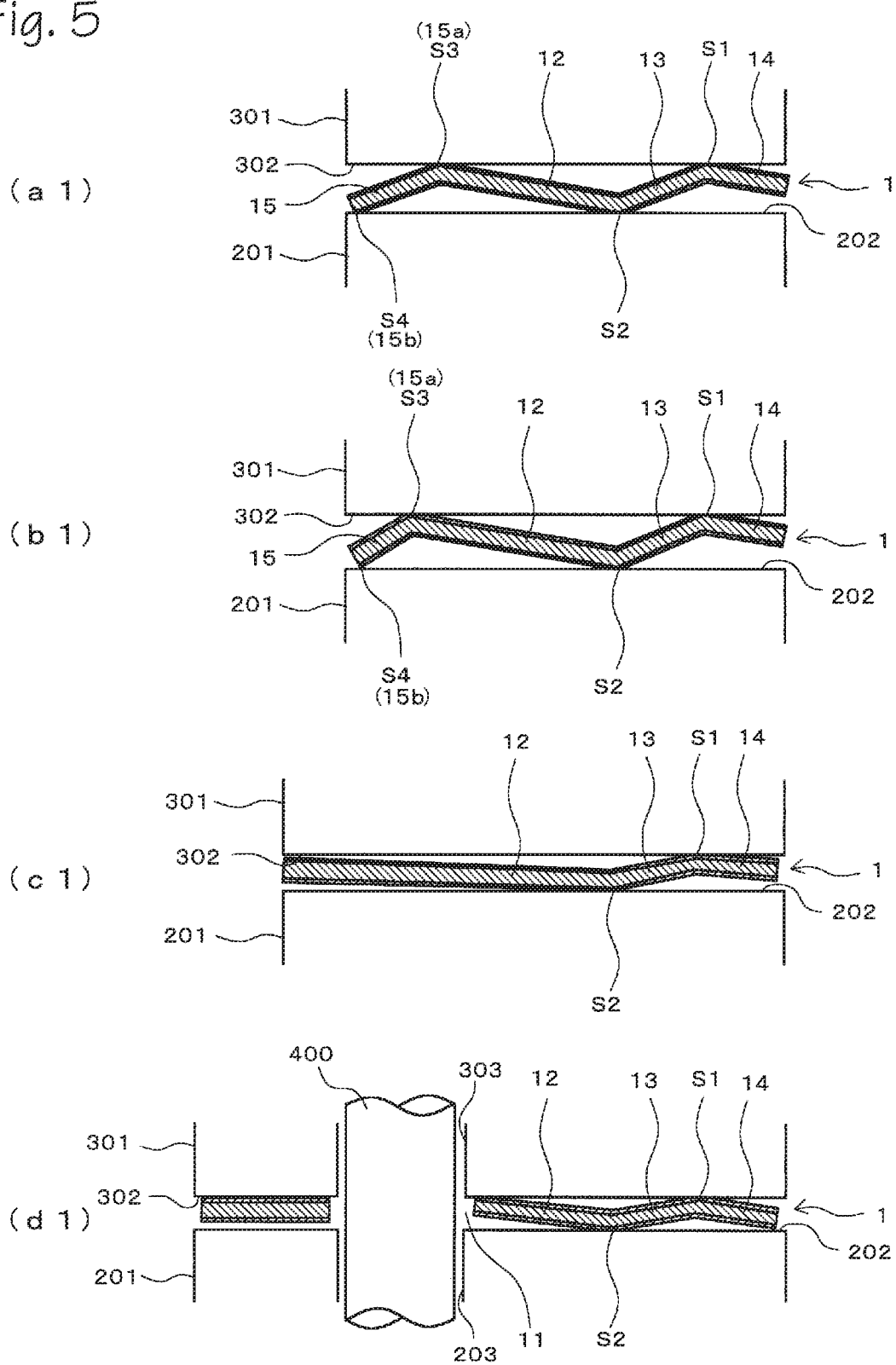
FIGS. 5($a1$), 5($b1$), 5($c1$), and 5($d1$) are end views at the time when the metal gasket illustrated in FIGS. 4($a1$), 4($b1$), 4($c1$), and 4($d1$) is fastened with a bolt.

In the same manner as conventional art, the peripheral creased section 15 reduces the space between the abutting surfaces 202 and 302 to the minimum to prevent infiltration of saline. As illustrated in FIGS. 5(c1) and 5(d1), the peripheral creased section 15 is bent as one unitary piece to form an inclined surface inclined downward from the end section of the perimeter of the first flat section 12, that is, in a direction opposite to the rising direction of the half bead section 13, not to project outward from the abutting surfaces 202 and 302 of the flange sections 201 and 301.

However, in the first embodiment, as illustrated in FIG. 2 and FIG. 3, the peripheral creased section 15 is not formed in the vicinity of the bolt holes 11, but formed in the perimeter of the metal base plate 10a except the vicinity of the bolt holes 11. Accordingly, the peripheral creased section 15 is not formed over the entire perimeter of the metal base plate 10a. As illustrated in FIGS. 4(c1) and 4(d1), in the vicinity of the bolt holes 11, the first flat section 12 extends to the perimeter of the metal base plate 10a as it is.

The vicinity of the bolt holes 11 means the regions each ranging from the bolt hole 11 to a section slightly outside a region 11a around the bolt hole 11 corresponding to a bolt seating surface (the surface on which the head section of the bolt 400 is seated on the top surface of the flange section 301).

The metal gasket 1 structured as described above is disposed between the flange sections 201 and 301, and fastened as one unitary piece with bolts 400 inserted through the bolt holes 203, 303, and 11, as illustrated in FIG. 5. The right side in FIG. 5 is the internal side of the housing 100, and the left side is the external side thereof. In the metal gasket 1 in this state, the half bead section 13 is compressed and elastically deformed to be reduced in its thickness between the abutting surfaces 202 and 302 of the flange sections 201 and 301, and the metal gasket 1 seals the abutting surfaces 202 and 302 by reaction force of the half bead section 13 in this state. S1 and S2 in FIG. 5 illustrate sealing sections formed of the half bead section 13.

In addition, the half bead section 13 is compressed, and a section on a more peripheral side than the sealing section S2 leaps up toward the abutting section 302 of the flange section 301, by the leverage with the sealing section S2 serving as the fulcrum. In the region provided with the peripheral creased section 15 in FIGS. 5(a1) and 5(b1), a bent section (internal end section 15a of the peripheral creased section 15) in a boundary between the first flat section 12 and the peripheral creased section 15 contacts the abutting surface 302, to form a sealing section S3. An external end section 15*b* of the peripheral creased section 15 contacts the abutting surface 202 of the flange section 201, thereby forming a sealing section S4.

In this manner, in the region provided with the peripheral creased section 15, the space on more peripheral side than the sealing section S3 is substantially filled with the peripheral creased section 15. Accordingly, in the region provided with the peripheral creased section 15, no gap in which sprayed saline enters and accumulates is formed, like conventional art. This structure prevents stay of saline, and delays occurrence of corrosion due to saline in the abutting surfaces 202 and 302.

In addition, in the metal gasket 1, the peripheral creased section 15 that is not easily compressed in fastening the bolts is not formed in the vicinity of the bolt holes 11, and no loss of the bolt fastening axial force occurs. In this case, there is the fear of adhesion and stay of saline due to absence of the peripheral creased section 15 therein. However, as illustrated in FIGS. 5(*c*1) and 5(*d*1), the bolt fastening axial force is increased in the vicinity of the bolt holes 11, and the holding force with the flange sections 201 and 301 in a sandwiched manner is increased. For this reason, in the first flat section 12 around the bolt hole 11, high surface pressure is generated by high rigidity, and the flange sections 201 and 301 are fastened to a degree with which the first flat section 12 of the metal gasket 1 substantially fills the space between the abutting surfaces 202 and 302. Accordingly, a gap in which saline enters and accumulates hardly occurs between the abutting surfaces 202 and 302, also in the vicinity of the bolt holes 11. Specifically, the high surface pressure in fastening the bolts serves as a substitute for the peripheral creased section 15, in the vicinity of the bolt holes 11.

The folding length L of the peripheral creased section 15 preferably falls within a range of 0.3 mm to 5.0 mm. This structure effectively prevents occurrence of a gap in which saline accumulates. The folding length L smaller than 0.3 mm degrades the compressibility of the peripheral creased section 15, and increases the loss of the bolt fastening axial force. The folding length L longer than 5.0 mm degrades the reaction force property in compression of the peripheral creased section 15, and degrades the contact surface pressure.

The folding length L is a length along an inclined surface extending from the internal end section 15*a* to the external end section 15*b* of the peripheral creased section 15 that is bent in an inclined manner, as illustrated in FIGS. 4(*a*1) and 4(*b*1).

The folding length L of the peripheral creased section 15 is formed to gradually change in the gasket circumferential direction to become shorter toward the perimeter in the vicinity of the bolt hole 11 that is not provided with the peripheral creased section 15. Specifically, as illustrated in FIGS. 4(*a*1) and 4(*b*1), "L11>L12" is satisfied with a folding length L11 of the peripheral creased section 15 in a region distant from the bolt hole 11, and a folding length L12 of the peripheral creased section 15 in a region close to the bolt hole 11. The folding length of the peripheral creased section 15 therebetween is formed to gradually change in the gasket circumferential direction. This structure enables the region suppressing infiltration of saline to smoothly extend from the peripheral creased section 15 to the vicinity of the bolt holes 11, and further enhances the saline infiltration suppressing effect over the entire perimeter of the metal gasket 1.

Figure 6:
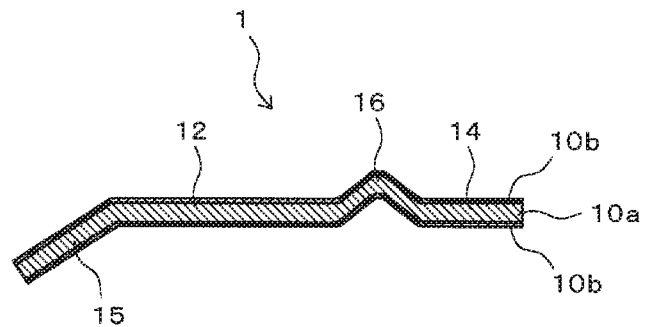
FIG. 6 is an end view illustrating an example of a metal gasket in which a full bead section is formed as a bead section, and cut in the same region as line (a1)-(a1) in FIG. 3.

The bead section included in the metal gasket 1 is not limited to the half bead section 13 as described above, but may be a full bead section 16, for example, as illustrated in FIG. 6. FIG. 6 is an end view of a metal gasket provided with the full bead section 16 and cut in the same region as line (a1)-(a1) in FIG. 3. The elements of the same reference numerals as those of FIG. 4 are elements of the same structures as those of FIG. 4, and explanation thereof is omitted herein, citing the explanation of FIG. 4.

The full bead section 16 is formed in a bent shape that slants from the internal circumferential section (the right end section in FIG. 6) of the first flat section 12 toward one of the thickness direction (the upward direction in FIG. 6) of the metal base plate 10*a*, and slants down at the top toward the other of the thickness direction (the downward direction in FIG. 6) of the metal base plate 10*a*. The second flat section 14 is formed in a bent shape to be connected with the internal circumferential section (the right end section in FIG. 6) of the full bead section 16. The same effect as that described above can also be obtained by forming the full bead section 16 as the bead section.

As illustrated in FIG. 3, as for the metal gasket 1, a recognition projection 17 to recognize whether the gasket is attached is preferably formed in the perimeter of the metal base plate 10*a* in which the peripheral creased section 15 is not formed, that is, the perimeter of the metal base plate 10*a* in the vicinity of the bolt hole 11. The recognition projection 17 projects further sideward from the projecting section 1*b* in the vicinity of the bolt hole 11. The recognition projection 17 is formed to project sideward from the section between the flange sections 201 and 301 when the metal gasket 1 is attached between the flange sections 201 and 301. This structure enables easy visual recognition of attachment of the metal gasket 1 between the case member 200 and the lid member 300.

In the case of forming a peripheral creased section folded with a fixed folding length and height over the entire perimeter of the metal gasket as in conventional art, existence of the peripheral creased section obstructs formation of such a recognition projection 17. By contrast, according to the present embodiment, the peripheral creased section 15 does not exist in the vicinity of the bolt holes 11, the recognition projection 17 can be formed in the vicinity of the bolt hole 11. It suffices that the recognition projection 17 is formed in at least one position of the region in which the peripheral creased section 15 is not formed, in the perimeter of the metal gasket 1.

Figure 7:
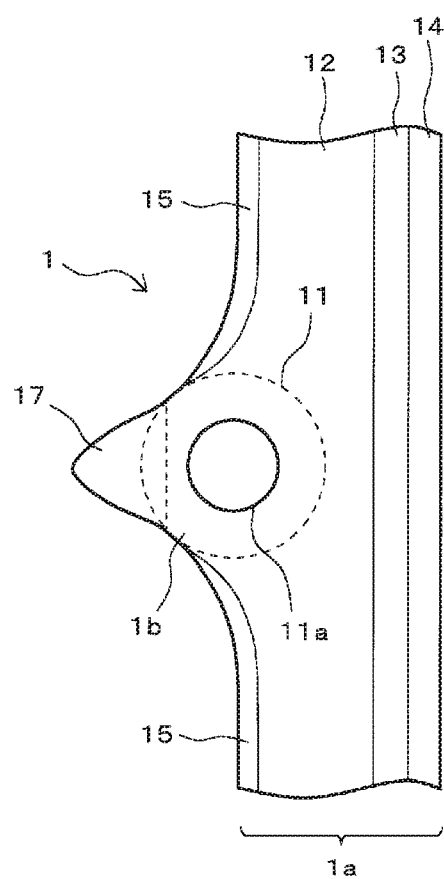
FIG. 7 is a partly enlarged plan view illustrating another embodiment of a recognition projection.

The recognition projection 17 illustrated in FIG. 3 is partly formed in one of two inclined peripheral sections 1*c* and 1*c* in the projecting section 1*b* that are smoothly connected with the outer edge of the annular section 1*a*. However, as illustrated in FIG. 7, the recognition projection 17 may be formed by further extending the whole projecting section 1*b* sideward. The plane shape of the recognition projection 17 is not particularly limited, and not limited to the illustrated shape at all.

The explanation described above illustrates an example in which the metal gasket 1 according to the first embodiment is applied as a sealing member between the flange sections 201 and 301 of the case member 200 and the lid member 300 of the housing 100. However, the metal gasket 1 according to the first embodiment of the present invention is not limited to one applied to the housing 100 as described above, but may be broadly applied to the cases of sealing abutting surfaces of two members.

Second Embodiment

A metal gasket according to the second embodiment has a structure in which the peripheral creased section is formed over the entire perimeter of the metal base plate, and its folding length and folding height are formed to gradually change in the gasket circumferential direction such that the folding length becomes longer and the folding height becomes shorter toward the bolt holes, to suppress loss of the bolt fastening axial force in compression with the bolts.

Figure 8:
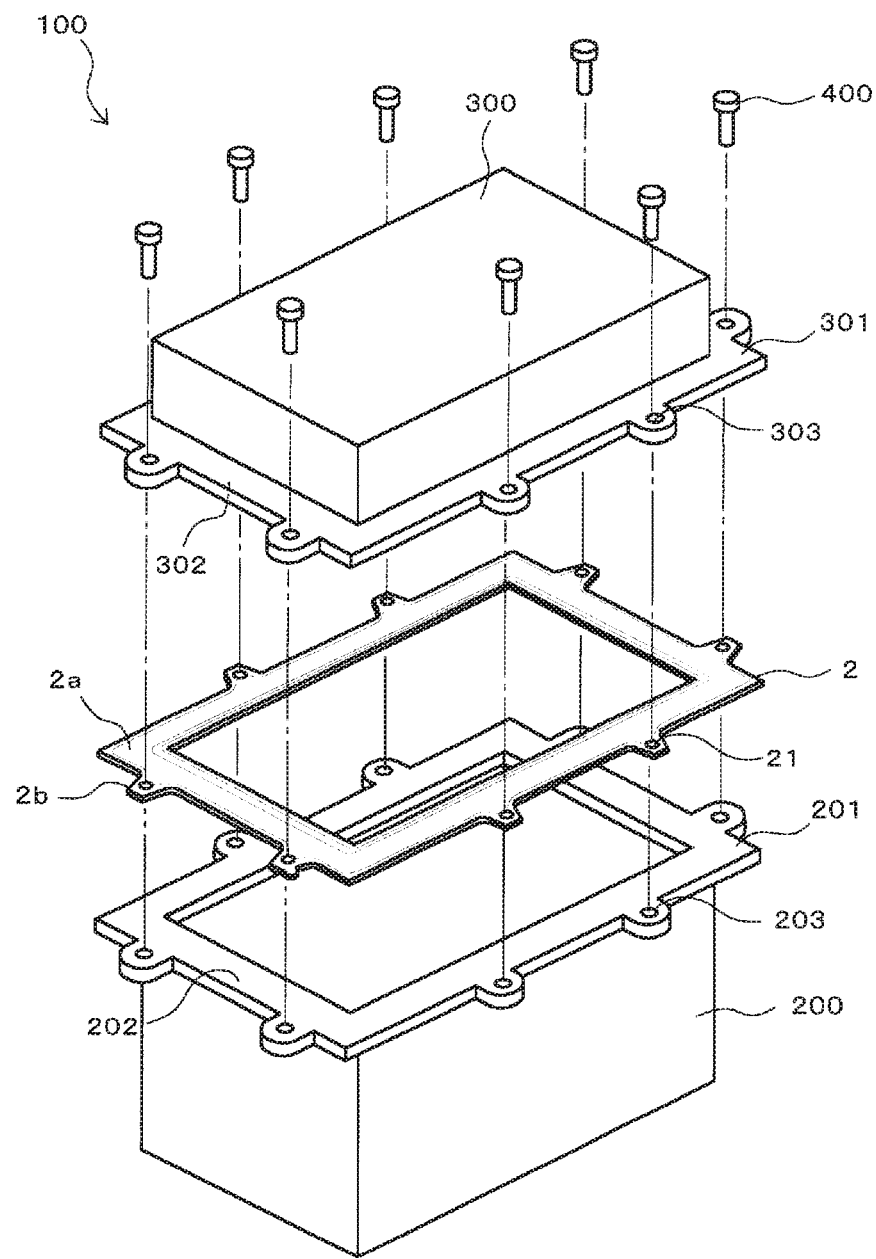
FIG. 8 is an exploded perspective view of a housing to which an example of a metal gasket according to a second embodiment of the present invention is applied.
Figure 9:
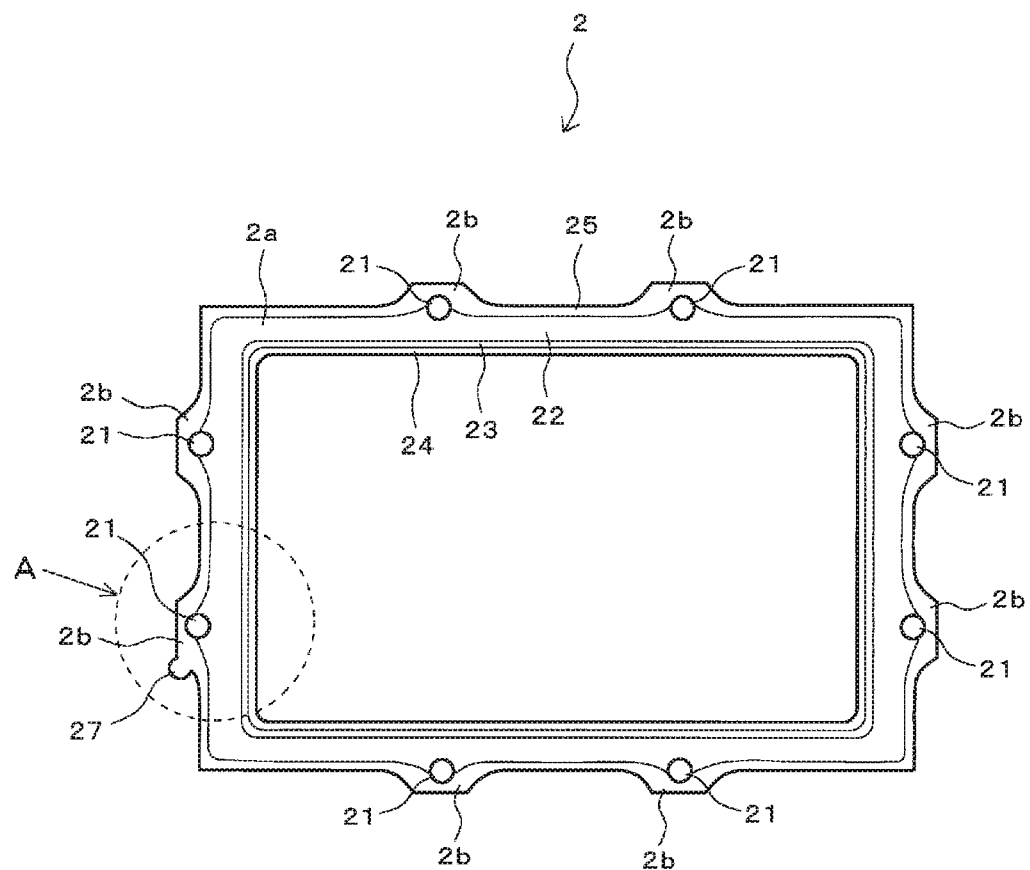
FIG. 9 is a plan view of the metal gasket illustrated in FIG. 8.
Figure 10:
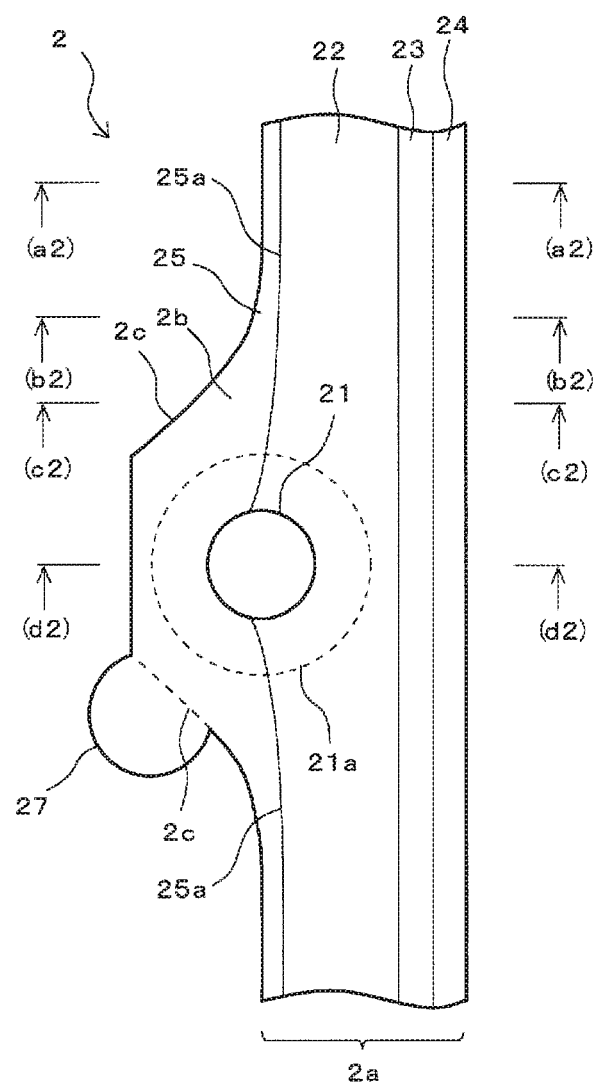
FIG. 10 is a partly enlarged plan view of a part A enclosed with a broken line in FIG. 9.
Figure 11:
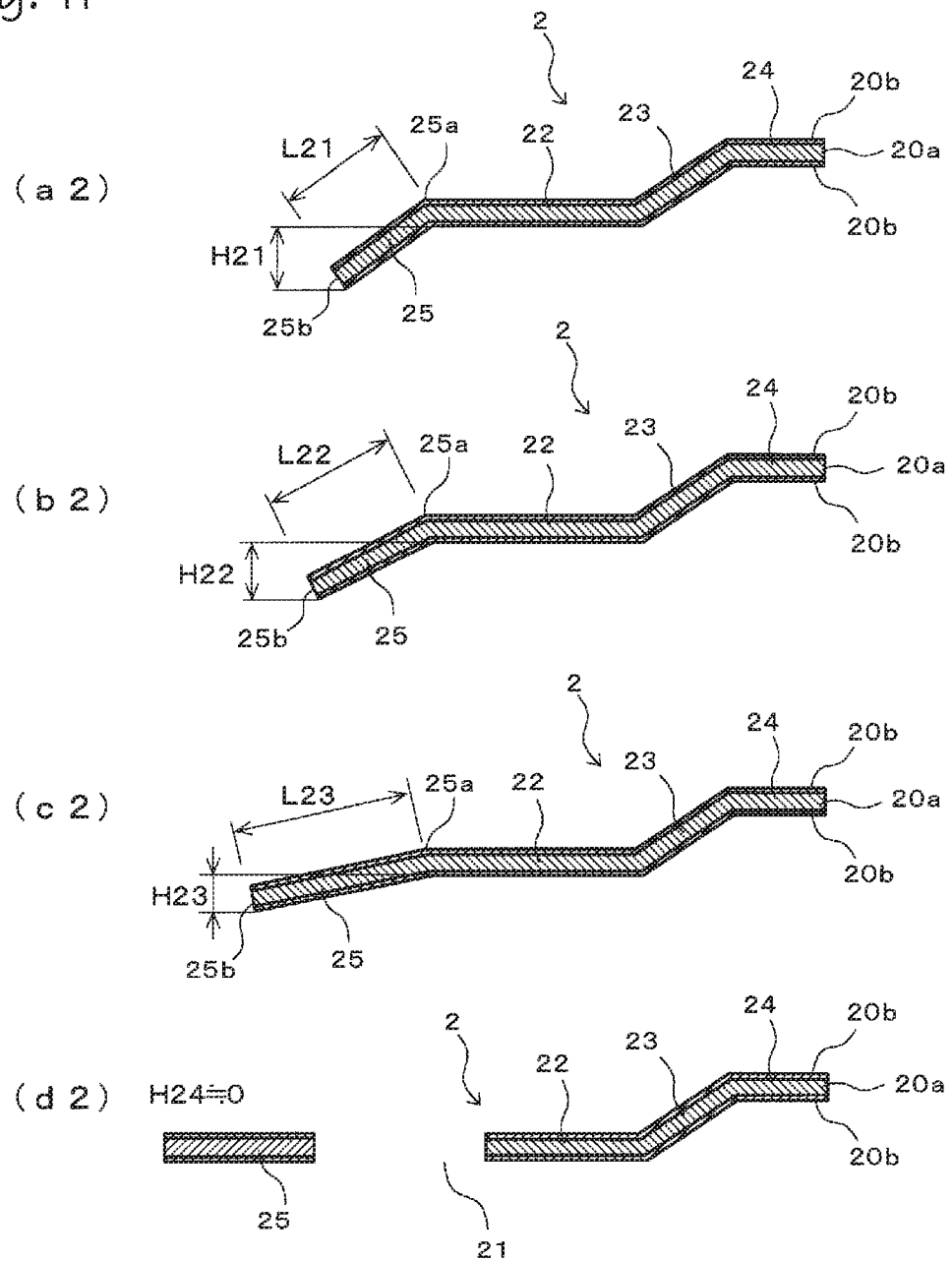
FIGS. 11($a2$), 11($b2$), 11($c2$), and 11($d2$) are end views taken along line (a2)-(a2), line (b2)-(b2), line (c2)-(c2), and line (d2)-(d2) in FIG. 10, respectively.
Figure 12:
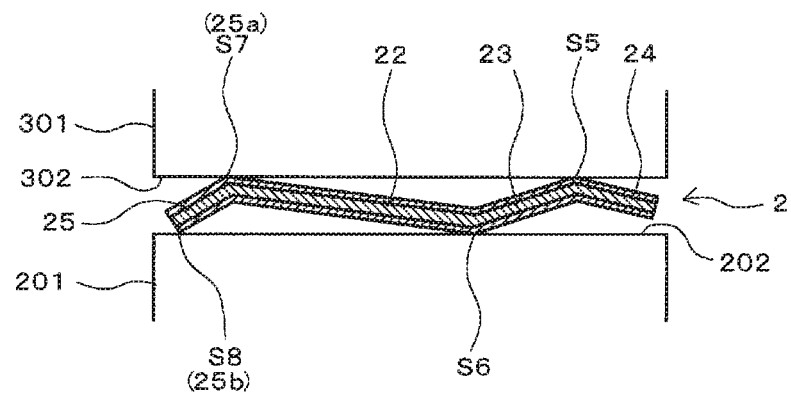
FIGS. 12($a2$), 12($b2$), 12($c2$), and 12($d2$) are end views at the time when the metal gasket illustrated in FIGS. 11($a2$), 11($b2$), 11($c2$), and 11($d2$) is fastened with a bolt.
Figure 12:
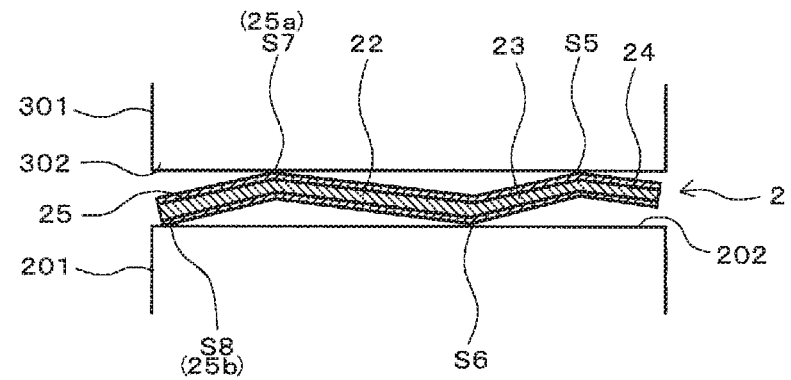
Figure 12:
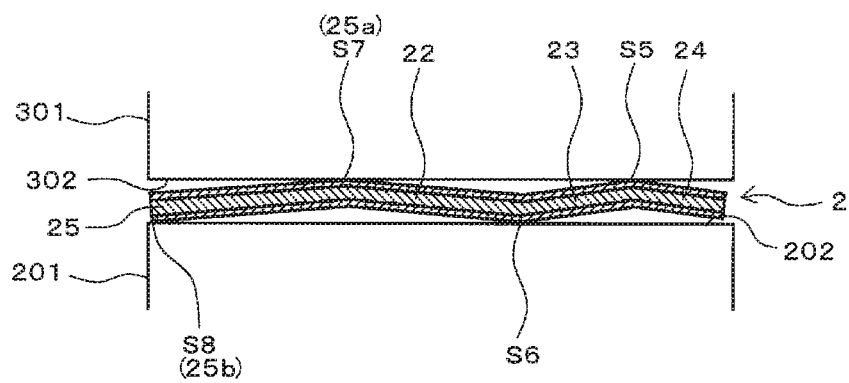
Figure 12:
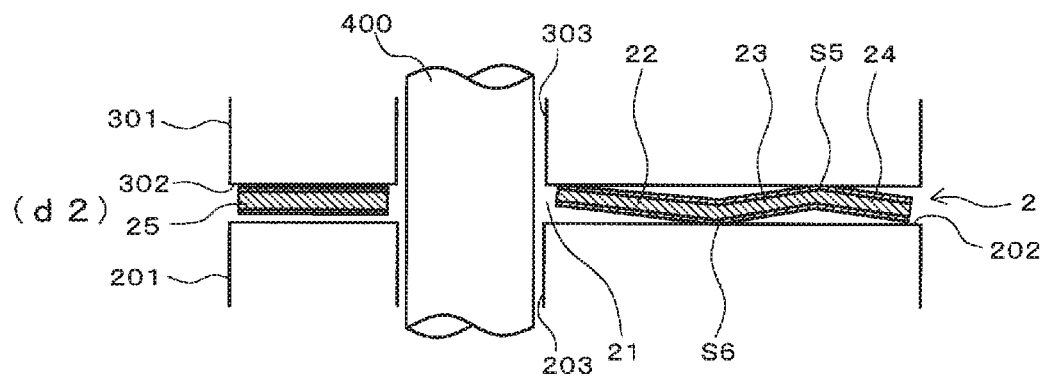

FIG. 8 is an exploded perspective view of a housing to which an example of the metal gasket according to the second embodiment of the present invention is applied, FIG. 9 is a plan view of the metal gasket illustrated in FIG. 8, FIG. 10 is a partly enlarged plan view of a part A enclosed with a broken line in FIG. 9, FIGS. 11(a2), 11(b2), 11(c2), and 11(d2) are end views taken along line (a2)-(a2), line (b2)-(b2), line (c2)-(c2), and line (d2)-(d2) in FIG. 10, respectively, and FIGS. 12(a2), 12(b2), 12(c2), and 12(d2) are end views at the time when the metal gasket illustrated in FIGS. 11(a2), 11(b2), 11(c2), and 11(d2) is fastened with a bolt.

With respect to the housing 100, the elements of the same reference numerals as those in the first embodiment are elements of the same structures as those in the first embodiment, and explanation thereof is omitted, citing the explanation of the first embodiment.

As illustrated in FIG. 9 and FIG. 10, a metal gasket 2 includes an annular section 2a and projecting sections 2b. The annular section 2a is formed with a fixed width similar to the abutting surfaces 202 and 302 of the respective flange sections 201 and 301 of the case member 200 and the lid member 300. The projecting sections 2b are located in positions corresponding to the respective bolt holes 203 and 303 of the flange sections 201 and 301, and partly project sideward from the annular section 2a to be connected therewith with a smooth curve. Each of the projecting sections 2b is provided with a bolt hole 21 corresponding to the bolt holes 203 and 303 of the flange sections 201 and 301.

In the housing 100, the case member 200, the lid member 300, and the metal gasket 2 are fastened in one unitary piece with bolts 400 inserted through the bolt holes 203, 303, and 11. The metal gasket 2 held between the flange sections 201 and 301 seals the abutting surfaces 202 and 302 of the flange sections 201 and 301.

The following is explanation of the metal gasket 2.

As illustrated in FIG. 11, the metal gasket 2 has a layered structure in which surfaces (front and rear surfaces) of a metal base plate 20a are covered with rubber-like elastic members 20b. This is a preferable form in the present invention. The rubber-like elastic members 20b on the surfaces elastically and closely contact the abutting surfaces 202 and 302, to enhance the sealing properties, and exert the effect of preventing the metal gasket 2 from corroding by saline adhering thereto.

The metal base plate 20a and the rubber-like elastic member 20b are formed of materials similar to those of the first embodiment described above. In addition, a surface preparation layer is preferably formed on each surface of the metal base plate 20a, in the same manner as the first embodiment.

The metal gasket 2 is formed by bending the metal base plate 20a to have a shape including a first flat section 22, a half bead section 23, and a second flat section 24. The half bead section 23 is formed to slant toward one of the thickness direction (the upward direction in FIG. 11) of the metal base plate 20a in the internal circumferential section (right end section in FIG. 11) of the first flat section 22. The second flat section 24 is formed in more internal circumferential section than the half bead section 23 and in substantially parallel to the first flat section 22.

The bolt holes 21 are disposed in the respective projecting sections 2b formed of the first flat section 22 projecting sideward. The half bead section 23 and the second flat section 24 are disposed on more internal circumferential side than the bolt holes 21. As illustrated in FIGS. 11(a2) and 11(b2), the perimeter (the left end section in FIG. 11) of the first flat section 22 is provided with a peripheral creased section 25 that is folded toward the other of the thickness direction (downward direction in FIG. 11) of the metal base plate 20a. The reference numeral 21a in FIG. 10 indicates a region around the bolt hole 21 corresponding to the bolt seating surface (the surface on which the head section of the bolt 400 is seated on the top surface of the flange section 301).

In the same manner as conventional art, the peripheral creased section 25 reduces the space between the abutting surfaces 202 and 302 to the minimum to prevent infiltration of saline. As illustrated in FIGS. 12(c2) and 12(d2), the peripheral creased section 25 is bent as one unitary piece to form an inclined surface inclined downward from the end section of the perimeter of the first flat section 22, that is, in a direction opposite to the rising direction of the half bead section 23, not to project outward from the abutting surfaces 202 and 302 of the flange sections 201 and 301.

In the second embodiment, as illustrated in FIG. 9, the peripheral creased section 25 is formed over the entire perimeter of the metal gasket 2 (metal base plate 20a). In the region of each bolt hole 21, an internal end section 25a of the peripheral creased section 25 is disposed to extend across the bolt hole 21, and substantially the whole projecting section 2b serves as the peripheral creased section 25.

However, as illustrated in FIG. 10 and FIG. 11, a folding length L and a folding height H of the peripheral creased section 25 are not fixed over the entire perimeter of the metal gasket 2, but are formed to gradually change in the gasket circumferential direction. The folding length L becomes longer and the folding height H becomes shorter toward each bolt hole 21, specifically, toward each bolt hole 21 in the projecting section 2b.

Specifically, as illustrated in FIGS. 11(a2), 11(b2), and 11(c2), the folding length L of the peripheral creased section 25 satisfies "L21<L22<L23", and gradually becomes longer toward the bolt hole 21. The folding height H satisfies "H21>H22>H23", and gradually becomes shorter toward the bolt hole 21. In the end surface extending through the center of the bolt hole 21 illustrated in FIG. 11(d2), the folding height H24 of the peripheral creased section 25 is close to 0 (H24=0), and formed substantially flat.

The folding length L is a length along an inclined surface extending from the internal end section 25a to the external end section 25b of the peripheral creased section 25 that is bent in an inclined manner, as illustrated in FIGS. 11(a2), 11(b2), and 11(c2). The folding height H is a height from the lower surface (the surface on the side at which the peripheral creased section 25 is folded) of the first flat section 22 to an end edge of the external end section 25b of the peripheral creased section 25.

The metal gasket 2 structured as described above is disposed between the flange sections 201 and 301, and fastened as one unitary piece with bolts 400 inserted through the bolt holes 203, 303, and 11, as illustrated in FIG. 12. The right side in FIG. 12 is the internal side of the housing 100, and the left side is the external side thereof. In the metal gasket 2 in this state, the half bead section 23 is compressed and elastically deformed to be reduced in its thickness between the abutting surfaces 202 and 302 of the flange sections 201 and 301, and the metal gasket 2 seals the abutting surfaces 202 and 302 by reaction force of the half bead section 23 in this state. S5 and S6 in FIG. 12 illustrate sealing sections formed of the half bead section 23.

In addition, the half bead section 23 is compressed, and a section on a more peripheral side than the sealing section S6 leaps up toward the abutting section 302 of the flange section 301, by the leverage with the sealing section S6 serving as the fulcrum. A bent section (internal end section 25a of the peripheral creased section 25) in a boundary between the first flat section 22 and the peripheral creased section 25 contacts the abutting surface 302, thereby forming a sealing section S7. The external end section 25b of the peripheral creased section 25 contacts the abutting surface 202 of the flange section 201, thereby forming a sealing section S8.

In this manner, the space on more peripheral side than the sealing section S7 between the abutting surfaces 202 and 302 is substantially filled with the peripheral creased section 25. Accordingly, in the metal gasket 2, no gap in which sprayed saline enters and accumulates is formed, like conventional art. This structure prevents stay of saline, and delays occurrence of corrosion due to saline in the abutting surfaces 202 and 302.

In addition, in the metal gasket 2, because the folding length L and the folding height H of the peripheral creased section 25 are formed to gradually change in the gasket circumferential direction such that the folding length L becomes longer and the folding height H becomes shorter toward each bolt hole 21, the peripheral creased section 25 in the vicinity of the bolt hole 21 is easily compressed in comparison with other regions, and loss of the bolt fastening axial force is reduced. In addition, because high surface pressure is generated in fastening the bolts in the vicinity of the bolt holes 21, the peripheral creased section 25 is strongly held between the abutting surfaces 202 and 302 in a sandwiched manner, and no space is generated, as illustrated in FIG. 12(d2). This structure suppresses occurrence of a gap in which saline enters and accumulates between the abutting surfaces 202 and 302 over the entire peripheral of the metal gasket 2, and suppresses loss of the bolt fastening axial force.

The internal end section 25a of the peripheral creased section 25 is formed to extend across each bolt hole 21, but may be formed to contact the bolt hole 21.

The folding length L of the peripheral creased section 25 preferably falls within a range of 0.3 mm to 30.0 mm, and is formed to gradually become longer toward each bolt hole 21. This structure effectively prevents both occurrence of a gap in which saline accumulates, and reduction in loss of the bolt fastening axial force.

The folding length L smaller than 0.3 mm degrades the compressibility of the peripheral creased section 25, and increases the loss of the bolt fastening axial force. The folding length L longer than 30.0 mm degrades the reaction force property in compression of the peripheral creased section 25, and reduces the contact surface pressure.

Figure 13:
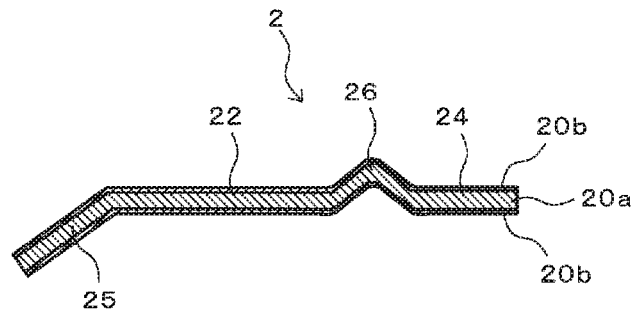
FIG. 13 is an end view illustrating an example of a metal gasket in which a full bead section is formed as a bead section, and cut in the same region as line (a2)-(a2) in FIG. 10.

The bead section included in the metal gasket 2 is not limited to the half bead section 23 as described above, but may be a full bead section 26, for example, as illustrated in FIG. 13. FIG. 13 is an end view of a metal gasket provided with the full bead section 26 and cut in the same region as line (a2)-(a2) in FIG. 10. The elements of the same reference numerals as those of FIG. 11 are elements of the same structures as those of FIG. 11, and explanation thereof is omitted herein, citing the explanation of FIG. 11.

The full bead section 26 is formed in a bent shape that slants from the internal circumferential section (the right end section in FIG. 13) of the first flat section 22 toward one of the thickness direction (the upward direction in FIG. 13) of the metal base plate 20a, and slants down at the top toward the other of the thickness direction (the downward direction in FIG. 13) of the metal base plate 20a. The second flat section 24 is formed in a bent shape to be connected with the internal circumferential section (the right end section in FIG. 13) of the full bead section 26. The same effect as that described above can also be obtained by forming the full bead section 26 as the bead section.

As illustrated in FIG. 10, as for the metal gasket 2, a recognition projection 27 to recognize whether the gasket is attached is preferably formed in the perimeter of the metal base plate 20a in which the peripheral creased section 25 is not formed, that is, the perimeter of the metal base plate 20a in the vicinity of the bolt hole 21. The recognition projection 27 projects further sideward from the projecting section 2b in the vicinity of the bolt hole 21.

The recognition projection 27 is formed to project sideward from the section between the flange sections 201 and 301 when the metal gasket 2 is attached between the flange sections 201 and 301. This structure enables easy visual recognition of attachment of the metal gasket 2 between the case member 200 and the lid member 300.

In the case of forming a peripheral creased section folded with a fixed folding length and height over the entire perimeter of the metal gasket as in conventional art, existence of the peripheral creased section obstructs formation of such a recognition projection 27. By contrast, according to the present embodiment, the peripheral creased section 25 is formed with a longer folding length L and a shorter folding height H in the vicinity of the bolt holes 21, the recognition projection 27 can be formed in the vicinity of the bolt hole 21. It suffices that the recognition projection 27 is formed in at least one position of the region in which the peripheral creased section 25 is not formed, in the perimeter of the metal gasket 2.

Figure 14:
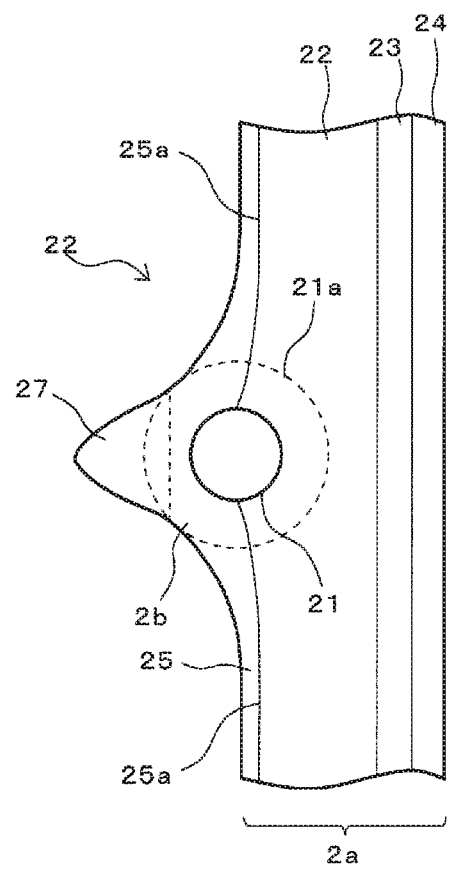
FIG. 14 is a partly enlarged plan view illustrating another embodiment of a recognition projection.

The recognition projection 27 illustrated in FIG. 10 is partly formed in one of two inclined peripheral sections 2c and 2c in the projecting section 2b that are smoothly connected with the outer edge of the annular section 2a. However, as illustrated in FIG. 14, the recognition projection 27 may be formed by further extending the whole projecting section 2b sideward. The plane shape of the recognition projection 27 is not particularly limited, and not limited to the illustrated shape at all.

The explanation described above illustrates an example in which the metal gasket 2 according to the second embodiment is applied as a sealing member between the abutting surfaces 202 and 302 of the case member 200 and the lid member 300 of the housing 100. However, the metal gasket 2 according to the second embodiment of the present invention is not limited to one applied to the housing 100 as described above, but may be broadly applied to the cases of sealing abutting surfaces of two members.

Third Embodiment

A metal gasket according to a third embodiment has a structure in which an outer edge of the metal base plate is provided with a curved section with a small radius of curvature, and the folding width of the peripheral creased section is formed to gradually change around the curved section when the peripheral creased section is formed over the entire perimeter of the metal base plate, to suppress loss of the bolt fastening axial force in compression with bolts.

Figure 15:
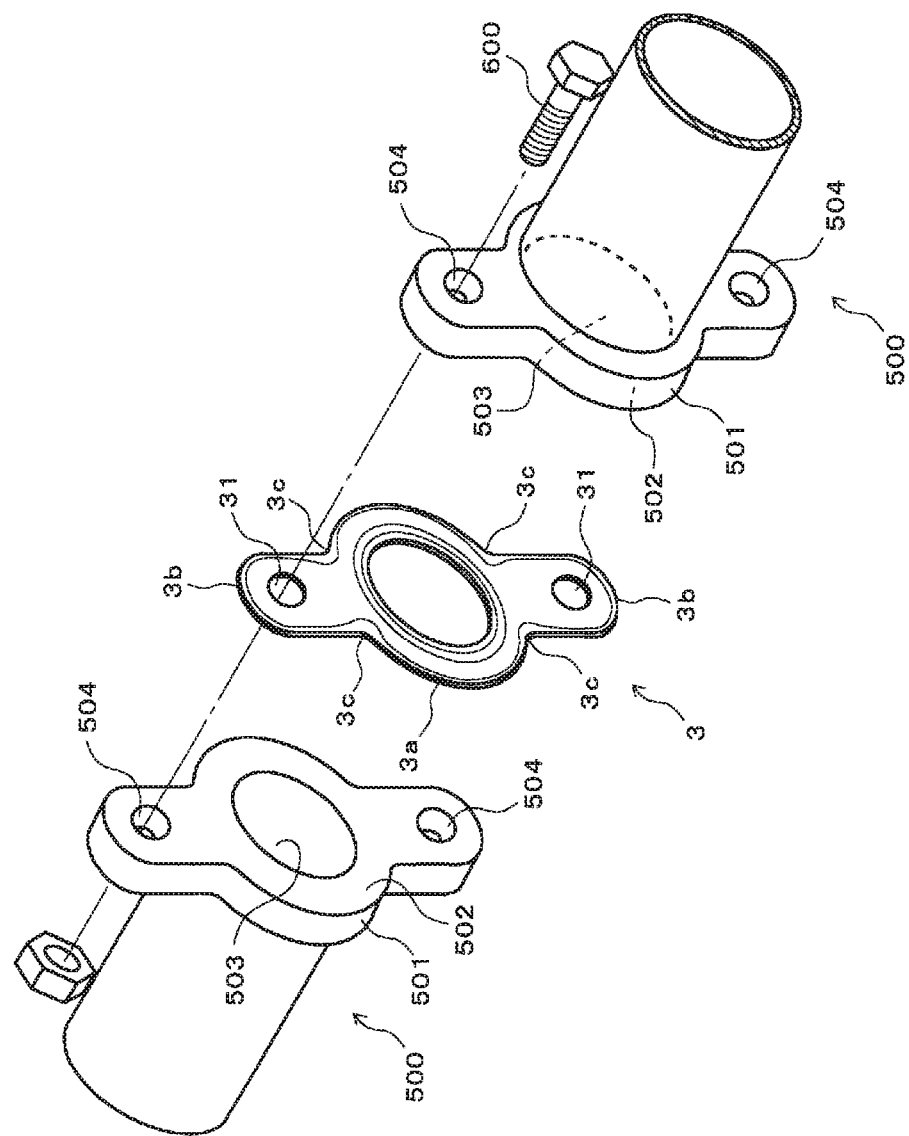
FIG. 15 is an exploded perspective view of flange joints to which an example of a metal gasket according to a third embodiment of the present invention is applied.
Figure 16:
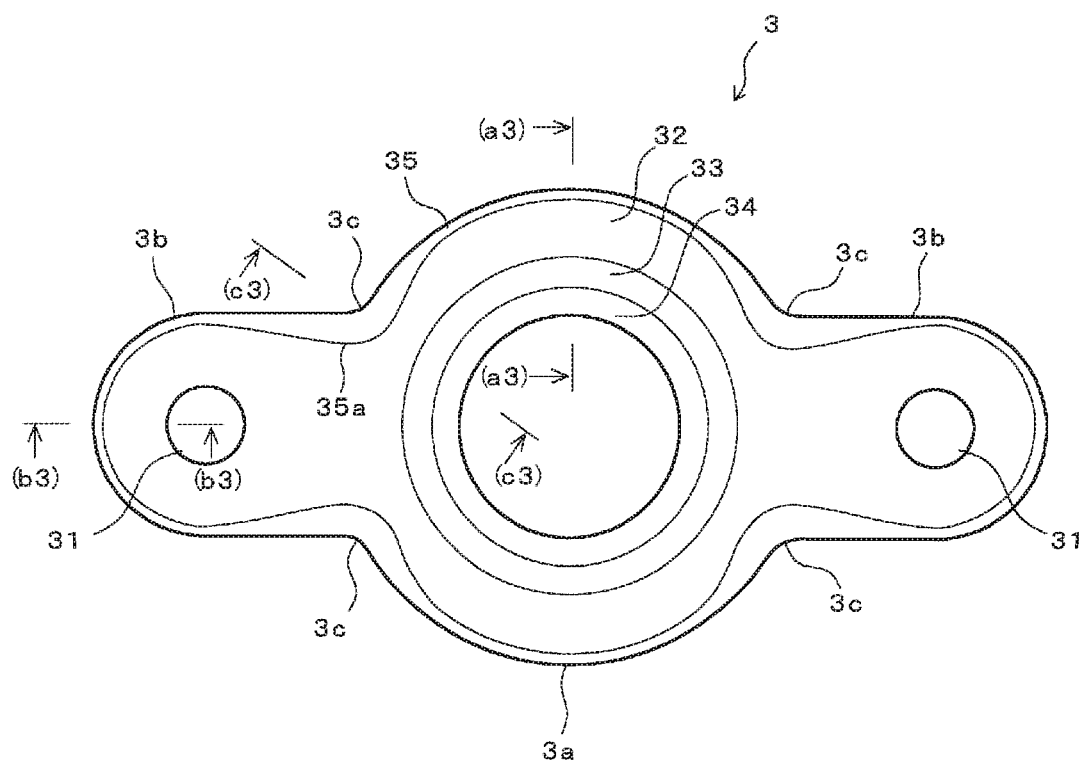
FIG. 16 is a plan view of the metal gasket illustrated in FIG. 15.
Figure 17:
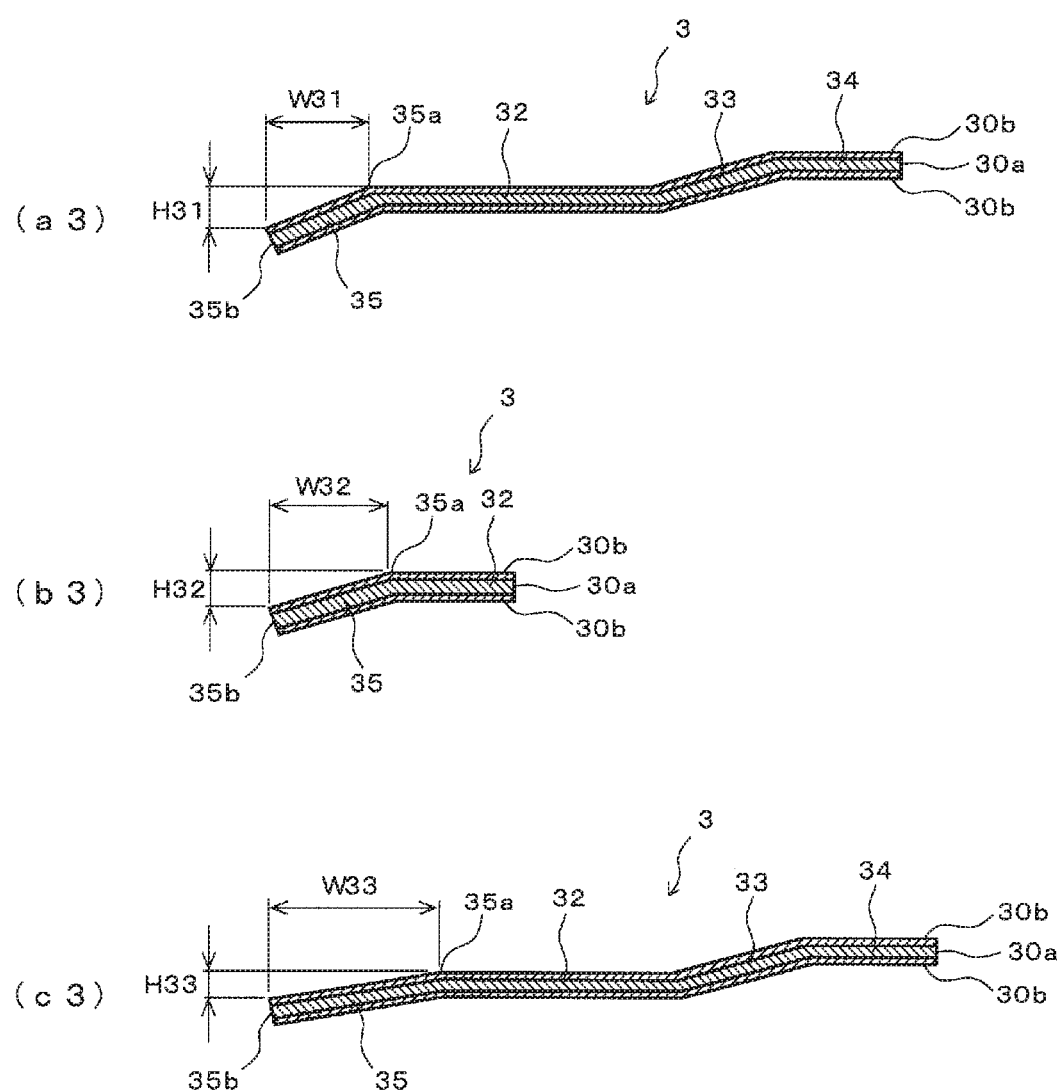
FIGS. 17($a3$), 17($b3$), and 17($c3$) are end views taken along lines (a3)-(a3), (b3)-(b3), and (c3)-(c3) in FIG. 16.
Figure 18:
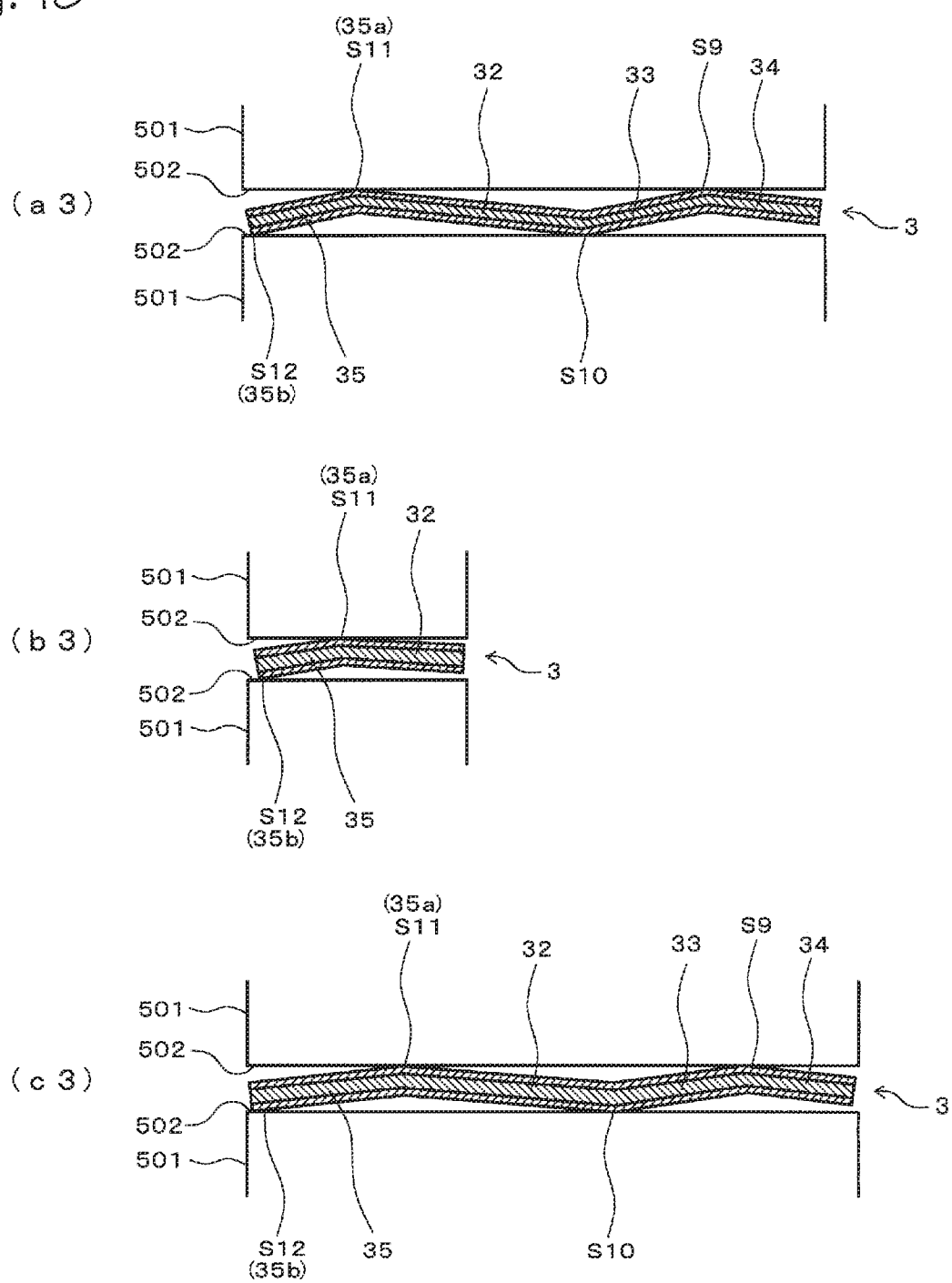
FIGS. 18($a3$), 18($b3$), and 18($c3$) are end views at the time when the metal gasket illustrated in FIGS. 17($a3$), 17($b3$), and 17($c3$) is fastened with a bolt.

FIG. 15 is an exploded perspective view of flange joints to which an example of a metal gasket according to the third embodiment of the present invention is applied, FIG. 16 is a plan view of the metal gasket illustrated in FIG. 15, FIGS. 17(*a*3), 17(*b*3), and 17(*c*3) are end views taken along lines (a3)-(a3), (b3)-(b3), and (c3)-(c3) in FIG. 16, and FIGS. 18(*a*3), 18(*b*3), and 18(*c*3) are end views at the time when the metal gasket illustrated in FIGS. 17(*a*3), 17(*b*3), and 17(*c*3) is fastened with a bolt.

As illustrated in FIG. 15, a pair of flange joints 500 and 500 include flange sections 501 and 501, respectively. A metal gasket 3 is disposed between abutting surfaces 502 and 502 of the flange sections 501 and 501. In the flange joints 500 and 500, at least one of the flange sections 501 is formed of an aluminum material that is easily corroded with saline, but may be formed of another material such as an iron-based material.

The abutting surface 502 of each flange section 501 is formed in an annular shape to surround a perimeter of an opening section 503 through which fluid runs, and includes regions each provided with a bolt hole 504 and projecting sideward in opposite directions in a tongue shape from the annular section.

The following is explanation of an example of the metal gasket 3.

The metal gasket 3 includes an annular section 3*a* and a pair of tongue-like sections 3*b* and 3*b*. The annular section 3*a* is formed in a shape similar to that of the abutting surface 502 of each flange joint 500, to surround the opening section 503. The tongue-like sections 3*b* and 3*b* project sideward in opposite directions from the annular section 3*a*. The tongue-like sections 3*b* and 3*b* are provided with bolt holes 31 and 31, respectively, in positions corresponding to the respective bolt holes 504 of each flange joint 500.

The metal gasket 3 is provided with four curved sections 3*c* that is round and curved in a recessed shape, in connecting regions between the annular section 3*a* and the tongue-like sections 3*b* in the outer edge. Each of the curved sections 3*c* has a radius of curvature of 20 mm or less, specifically, 1 mm to 20 mm, to form a relatively small R.

When the radius of curvature is smaller than 1 mm, the curved sections 3*c* may be cracked. When the radius of curvature exceeds 20 mm, the compression state should be made uniform by narrowing the folding width W of a peripheral creased section 35 described later.

As illustrated in FIG. 17, the metal gasket 3 has a layered structure in which surfaces (front and rear surfaces) of a metal base plate 30*a* are covered with rubber-like elastic members 30*b*. This is a preferable form in the present invention. The rubber-like elastic members 30*b* on the surface elastically and closely contact the abutting surfaces 502, to enhance the sealing properties, and exert the effect of preventing the metal gasket 3 from corroding by saline adhering thereto.

Examples of the metal base plate 30*a* include a stainless steel sheet, a cold-rolled steel sheet, a galvanized steel sheet, and an aluminum composite sheet. Examples of the rubber-like elastic member 30*b* include nitrile rubber, styrene butadiene rubber, fluororubber, acryl rubber, and silicon rubber. The rubber-like elastic rubber 30*b* may be one of these types of rubber, or synthetic rubber (including foam rubber) containing two or more of these types of rubber.

A surface preparation layer (not illustrated) is preferably formed on the surfaces of the metal base plate 30*a*, to improve adhesiveness to each rubber-like elastic member 30*b*.

The metal gasket 3 is formed by bending the metal base plate 30*a* to have a shape including a first flat section 32, a half bead section 33, and a second flat section 34. The half bead section 33 is formed to slant toward one of the thickness direction (the upward direction in FIG. 17) of the metal base plate 30*a* in the internal circumferential section (right end section in FIG. 17) of the first flat section 32. The second flat section 34 is formed in more internal circumferential section (right end section in FIG. 17) than the half bead section 33 and in substantially parallel to the first flat section 32.

Each bolt hole 31 is disposed in the first flat section 32 forming the tongue-like section 3*b*, and the half bead section 33 and the second flat section 34 are disposed on more internal circumferential side than the bolt hole 31. As illustrated in FIGS. 16 and 17, the perimeter (the left end section in FIG. 17) of the first flat section 32 is provided with a peripheral creased section 35 having a certain folding width W that is folded toward the other of the thickness direction (downward direction in FIG. 17) of the metal base plate 30*a*.

In the same manner as conventional art, the peripheral creased section 35 reduces the space between the abutting surfaces 502 and 502 to the minimum to prevent infiltration of saline. As illustrated in FIG. 18, the peripheral creased section 35 is bent as one unitary piece to form an inclined surface inclined downward from the peripheral end of the first flat section 32, that is, in a direction opposite to the rising direction of the half bead section 33, not to project outward from the abutting surfaces 502 of the flange sections 501.

In the present embodiment, the peripheral creased section 35 is formed over the entire perimeter of the metal base plate 30*a*. However, as illustrated in FIG. 16 and FIG. 17, a folding width W thereof is not fixed over the entire perimeter thereof, but the folding width W of the peripheral creased section 35 in the vicinity of the curved sections 3*c* is formed to gradually change in the gasket circumferential direction, as illustrated in FIG. 16.

Specifically, in the metal gasket 3 illustrated in FIGS. 16 and 17, the folding width W of the peripheral creased section 35 satisfies "W33>W32≥W31", when W31 is the folding width of the peripheral creased section 35 that is distant in one of the gasket circumferential direction from the curved section 3*c* as illustrated in FIG. 17(*a*3), W32 is the folding width of the peripheral creased section 35 that is distant in the other of the gasket circumferential direction from the curved section 3*c* as illustrated in FIG. 17(*b*3), and W33 is the folding width of the peripheral creased section 35 extending through the center of the curved section 3*c* as illustrated in FIG. 17(*c*3). The peripheral creased section 35 is formed such that the folding width W33 of the peripheral creased section 35 in the curved section 3*c* is widest. Specifically, the folding width of the peripheral creased section 35 of the metal gasket 3 is formed to gradually change in the gasket circumferential direction such that the folding width W becomes wider toward each curved section 3*c* from the outer edge of the metal base plate 30*a*.

As illustrated in FIGS. 17(*a*3), 17(*b*3), and 17(*c*3), the folding width W is a width obtained by measuring an inclined surface extending from the internal end section 35*a* to the external end section 35*b* of the peripheral creased section 35 formed in an inclined bent shape in a plan view state. In the first and the second embodiments, the value is indicated with the folding length along the inclined surface. In the third embodiment, the value is indicated with the folding width W. This is because the target region also includes gradual change in the region forming a relatively small R of 1 mm to 20 mm in the third embodiment.

The metal gasket 3 structured as described above is disposed between the abutting surfaces 502 and 502 of the flange sections 501 and 501 forming a pair, and fastened as one unitary piece with fastening tools 600 such as bolts inserted through the bolt holes 504 and 31, as illustrated in FIG. 15 and FIG. 18. The right side in FIG. 18 is the internal side of the flange joint 500, and the left side is the external side thereof. In the metal gasket 3 in this state, the half bead section 33 is compressed and elastically deformed to be reduced in its thickness between the abutting surfaces 502 and 502, and the metal gasket 3 seals the abutting surfaces 502 and 502 by reaction force of the half bead section 33 in this state. S9 and S10 in FIG. 18 illustrate sealing sections formed of the half bead section 33.

In addition, the half bead section 33 is compressed, and a section on a more peripheral side than the sealing section S10 leaps up toward the abutting section 502 on the upper side in FIG. 18, by the leverage with the sealing section S10 serving as the fulcrum. In addition, a bent section (internal end section 35a) in a boundary between the first flat section 32 and the peripheral creased section 35 contacts the abutting surface 502 on the upper side in FIG. 18, thereby forming a sealing section S11. The external end section 35b of the peripheral creased section 35 contacts the abutting surface 502 on the lower side in FIG. 18, thereby forming a sealing section S12.

In this manner, the space between the abutting surfaces 502 and 502 on more peripheral side than the sealing section S11 is substantially filled with the peripheral creased section 35. With the metal gasket 3, no gap in which sprayed saline enters and accumulates is formed, like conventional art. This structure prevents stay of saline, and delays occurrence of corrosion due to saline in the abutting surfaces 502 and 502. In this state, more preferably, grease is held between the abutting surfaces 502 and 502 to completely shut out infiltration of saline.

In addition, the peripheral creased section 35 around the curved sections 3c is configured to be easily compressed, because the folding width W is formed to gradually change in the gasket circumferential direction such that the folding width W33 in the curved section 3c is widest. This structure reduces loss of the bolt fastening axial force due to the peripheral creased section 35 around the curved section 3c in fastening the bolts, even when the curved sections 3c are relatively small with a radius of curvature of 20 mm or less. This structure improves the compressibility with the half bead section 33 serving as the main bead section, and achieves both the saline infiltration suppressing effect and the effect of improving the sealing function of the metal gasket 3.

Because the folding width W of the peripheral creased section 35 satisfies "W33>W32≥W31", the folding width W32 in the vicinity of each bolt hole 31 may be formed wider than the folding width W31. For this reason, there is the fear that a space in which saline stays is formed in the vicinity of the bolt hole 31. However, actually, because the vicinity of the bolt hole 31 is a region with good compressibility of the peripheral creased section 35 in fastening the bolt, the space in which saline stays is reduced, and there is little fear that saline adheres and stays therein.

Not only the folding width W but also the folding height H of the peripheral creased section 35 is preferably formed to gradually change in the gasket circumferential direction around the curved sections 3c. Specifically, the folding height H satisfies "H33<H32≤H31", when H31 is the folding height of the peripheral creased section 35 that is distant in one of the gasket circumferential direction from the curved section 3c as illustrated in FIG. 17(a3), H32 is the folding height of the peripheral creased section 35 that is distant in the other of the gasket circumferential direction from the curved section 3c as illustrated in FIG. 17(b3), and H33 is the folding height of the peripheral creased section 35 extending through the center of the curved section 3c as illustrated in FIG. 17(c3). Specifically, the folding height of the peripheral creased section 35 is formed to gradually change in the gasket circumferential direction such that the folding height H becomes shorter toward each curved section 3c from the outer edge of the metal base plate 30a.

This structure enables easier compression of the peripheral creased section 35 in the vicinity of the curved sections 3c, together with the gradually changing structure of the folding width W described above, and further improves the effect of reducing loss of the bolt fastening axial force in the vicinity of the bolt hole 31.

The folding height H is a height from the upper surface (surface from which the half bead section 33 rises) of the first flat section 32 to the end edge of the external end section 35b of the peripheral creased section 35, as illustrated in FIGS. 17(a3), 17(b3), and 17(c3).

Figure 19:
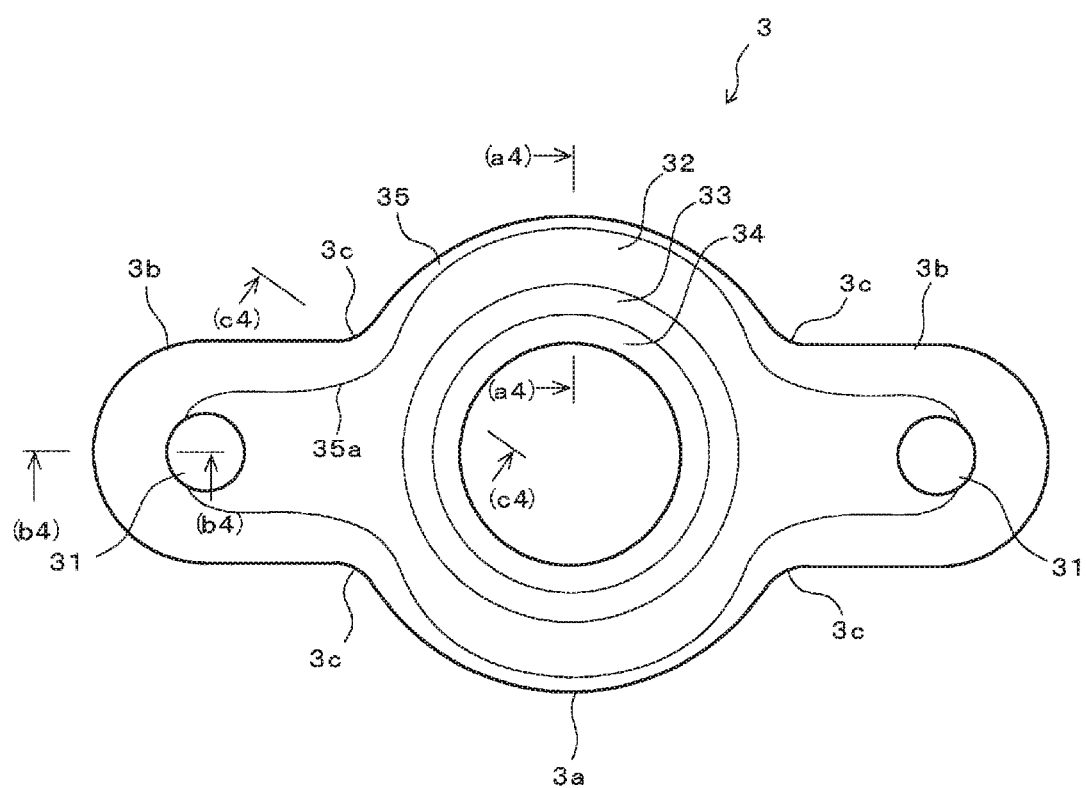
FIG. 19 is a plan view illustrating another example of the metal gasket according to the third embodiment.
Figure 20:
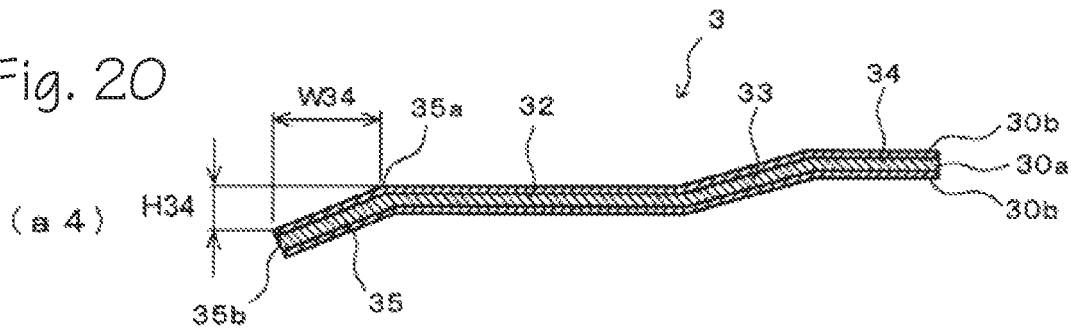
FIGS. 20($a4$), 20($b4$), and 20($c4$) are end views taken along lines (a4)-(a4), (b4)-(b4), and (c4)-(c4) in FIG. 19.
Figure 20:
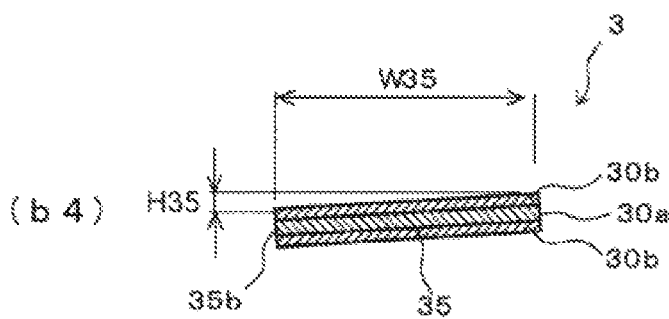
Figure 20:
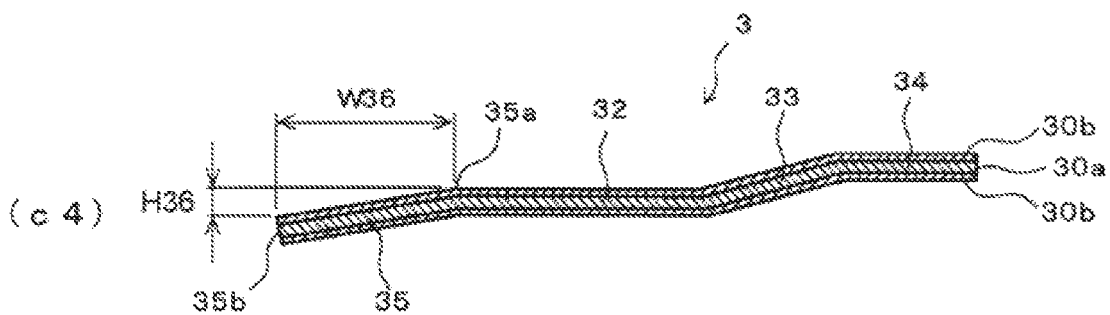

FIG. 19 is a plan view illustrating another example of the metal gasket according to the third embodiment, and FIGS. 20(a4), 20(b4), and 20(c4) are end views taken along lines (a4)-(a4), (b4)-(b4), and (c4)-(c4) in FIG. 19. The elements of the same reference numerals as those of FIG. 16 and FIG. 17 are elements of the same structures as those of FIG. 16 and FIG. 17, and explanation thereof is omitted herein, citing the explanation of FIG. 16 and FIG. 17.

This metal gasket 3 and the metal gasket 3 illustrated in FIG. 16 and FIG. 17 are the same in that the peripheral creased section 35 is formed over the entire perimeter of the metal base plate 30a, and the folding width W of the peripheral creased section 35 in the vicinity of the curved sections 3c is formed to gradually change in the gasket circumferential direction.

However, the metal gasket 3 in this example is formed such that the folding width W of the peripheral creased section 35 becomes wider toward the bolt hole 31 of each tongue-like section 3b from the curved sections 3c of the metal base plate 30a. Specifically, when the folding width W36 illustrated in FIG. 20(c4) extending through the center of the curved section 3c is compared with the folding width W34 distant in one of the gasket circumferential direction from the curved section 3c as illustrated in FIG. 20(a4), "W34<W36" is satisfied. However, when W36 is compared with the folding width W35 illustrated in FIG. 20(b4) distant in the other of the gasket circumferential direction from the curved section 3c and extending through the center of the bolt hole 31, "W35>W36" is satisfied.

In other words, the folding width W of the peripheral creased section 35 in the metal gasket 3 satisfies "W34<W36<W35", and becomes widest in the vicinity of the bolt holes 31. Specifically, the folding width W is formed to gradually change in the gasket circumferential direction such that the folding width W becomes gradually wider toward the curved sections 3c from the region illustrated in FIG. 20(a4), and the folding width W becomes gradually further wider toward the bolt holes 31 from the curved sections 3c.

This structure improves compressibility of the peripheral creased section 35 also in the vicinity of the bolt holes 31. Accordingly, this structure further reduces loss of the bolt fastening axial force, together with the effect of improving the compressibility of the peripheral creased section 35 in the curved sections 3c, and achieves both the saline infiltration suppressing effect and the effect of improving the sealing function with the metal gasket 3 on higher levels.

The internal end section 35*a* of the peripheral creased section 35 illustrated in FIG. 19 is disposed to extend across each bolt hole 31, but may be disposed to contact the bolt hole 31.

The folding height H of the peripheral creased section 35 is also preferably formed to become shorter toward the bolt holes 31, as illustrated in FIG. 20. The folding height H36 of the peripheral creased section 35 illustrated in FIG. 20(*c*4) satisfies "H34>H36", when it is compared with the folding height H34 illustrated in FIG. 20(*a*4). However, when the folding height H36 is compared with the folding height H35 illustrated in FIG. 20(*b*4), "H35<H36" is satisfied. In other words, the folding height H satisfies "H34>H36>H35".

Specifically, the folding height H of the peripheral creased section 35 in the metal gasket 3 is formed to gradually change in the gasket circumferential direction such that the folding height H becomes gradually shorter toward the curved sections 3*c* from the region illustrated in FIG. 20(*a*4), and the folding height H becomes gradually further shorter toward the bolt holes 31 from the curved sections 3*c*.

This structure enables easier compression of the peripheral creased section 35 in the vicinity of the curved sections 3*c* and the bolt holes 31, together with the gradually changing structure of the folding width W described above, and further improves the effect of reducing loss of the bolt fastening axial force.

In the present invention, the folding width W of the peripheral creased section 35 preferably falls within the range of 0.3 mm to 30.0 mm. The folding width W set in this range enables better acquisition of the saline infiltration suppressing effect and the effect of reducing loss of the bolt fastening axial force. The folding width W shorter than 0.3 mm causes locally high surface pressure. The folding width W longer than 30.0 mm causes difficulty in producing surface pressure required for preventing infiltration of saline.

Figure 21:
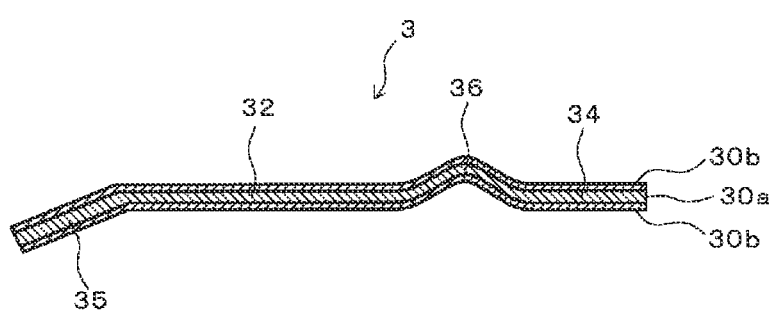
FIG. 21 is an end view illustrating an example of a metal gasket in which a full bead section is formed as a bead section.

The bead section formed in the metal gasket 3 is not limited to the half bead section 33 as described above, but may be a full bead section 36, for example, as illustrated in FIG. 21. The full bead section 36 is formed in a bent shape that slants from the internal circumferential section (the right end section in FIG. 21) of the first flat section 32 toward one of the thickness direction (the upward direction in FIG. 21) of the metal base plate 30*a*, and slants down at the top toward the other of the thickness direction (the downward direction in FIG. 21) of the metal base plate 30*a*. The second flat section 34 is formed to connect with the full bead section 36. The same effect as that described above can also be obtained by forming the full bead section 36 as the bead section.

The explanation described above illustrates an example including four curved sections 3*c* with the radius of curvature of 20 mm or less in the outer edge of the metal gasket 3, but the present invention is applicable to a metal gasket including at least one curved section 3*c* like this.

Each of the curved sections 3*c* is not limited to one that is curved in a recessed shape as described above, but may be a curved section that is curved in a projecting shape.

The explanation described above illustrates an example in which the metal gasket 3 according to the third embodiment is applied as a sealing member between the abutting surfaces 502 and 502 of the flange joints 500 and 500. However, the metal gasket 3 according to the third embodiment of the present invention is not limited to one applied to the flange joints 500 as described above, but is broadly applicable to the cases of sealing abutting surfaces between two members.

EXPLANATIONS OF LETTERS OR NUMERALS 1, 2, 3: METAL GASKET
1*a*, 2*a*: ANNULAR SECTION
1*b*, 2*b*: PROJECTING SECTION
1*c*, 2*c*: INCLINED PERIPHERAL SECTION
10*a*, 20*a*, 30*a*: METAL BASE PLATE
10*b*, 20*b*, 30*b*: RUBBER-LIKE ELASTIC MEMBER
11, 21, 31: BOLT HOLE
12, 22, 32: FIRST FLAT SECTION
13, 23, 33: HALF BEAD SECTION
14, 24, 34: SECOND FLAT SECTION
15, 25, 35: PERIPHERAL CREASED SECTION
15*a*, 25*a*, 35*a*: INTERNAL END SECTION
15*b*, 25*b*, 35*b*: EXTERNAL END SECTION
16, 26, 36: FULL BEAD SECTION
17, 27: RECOGNITION PROJECTION
100: HOUSING
200: CASE MEMBER
201: FLANGE SECTION
202: ABUTTING SURFACE
203: BOLT HOLE
300: LID MEMBER
301: FLANGE SECTION
302: ABUTTING SURFACE
303: BOLT HOLE
400: BOLT
500: FLANGE JOINT 100
501: FLANGE SECTION
502: ABUTTING SURFACE
503: OPENING SECTION
504: BOLT HOLE
600: BOLT
S1 TO S12: SEALING SECTION

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

We claim:

1. A metal gasket to be disposed between abutting surfaces of two members, the metal gasket comprising: a sheet of metal base plate including a bolt hole through which a bolt is configured to be inserted, a bead section that slants inwardly from the bolt hole and toward a thickness direction of the metal base plate in a rising direction for sealing a space between the abutting surfaces on a more internal circumferential side than the bolt hole, and an outer circumferential perimeter of the metal base plate angled in one direction forming a peripheral creased section configured to prevent formation of a gap in which saline accumulates between the abutting surfaces, wherein the peripheral creased section is one unitary piece forming an angled surface that is disposed in a direction both outwardly opposite and slanted opposite to the rising direction of the bead section, and the peripheral creased section includes a region with a folding length along the peripheral creased section configured so as to become shorter in the gasket circumferential direction toward the perimeter extending in a direction along the peripheral creased section in the vicinity of the bolt hole gradually changing in the gasket circumferential direction and configured to suppress loss of a bolt fastening axial force in compression with the bolt, wherein the peripheral creased section is omitted in vicinity of the bolt hole and disposed in the perimeter of the metal base plate except the vicinity of the bolt hole.

2. The metal gasket according to claim 1, wherein, in the perimeter of the metal base plate in which the peripheral creased section is not formed, a recognition projection to recognize whether the gasket is attached is formed, the recognition projection extending outward and sideward from the space between the abutting surfaces.

3. The metal gasket according to claim 1, wherein the folding length of the peripheral creased section falls within a range of 0.3 mm to 5.0 mm.

4. The metal gasket of claim 1, wherein the peripheral creased section is formed over an entire perimeter of the metal base plate, and has the folding length and a folding height that are formed to gradually change in the gasket circumferential direction such that the folding length becomes longer and the folding height becomes shorter toward the bolt hole, and wherein an end edge on an internal circumferential side of the peripheral creased section is disposed to contact the bolt hole or extend across the bolt hole.

5. The metal gasket according to claim 4, wherein, in the peripheral creased section in vicinity of the bolt hole, a recognition projection to recognize whether the gasket is attached, the recognition projection extending outward and sideward from the space between the abutting surfaces.

6. The metal gasket according to claim 4 wherein the folding width of the peripheral creased section falls within a range of 0.3 mm to 30.0 mm.

7. The metal gasket according to claim 1, further comprising: at least one curved section with a radius of curvature of 20 mm or less in an outer edge of the metal base plate, wherein the peripheral creased section is formed over an entire perimeter of the metal base plate, and has a folding width in vicinity of the curved section that gradually changes in the gasket circumferential direction.

8. The metal gasket according to claim 7, wherein the folding width of the peripheral creased section is formed to gradually change in the gasket circumferential direction such that the folding width becomes wider toward the curved section from the outer edge of the metal baseplate.

9. The metal gasket according to claim 7 wherein the folding width of the peripheral creased section is formed to gradually change in the gasket circumferential direction such that the folding width becomes wider toward the bolt hole from the curved section of the metal baseplate.

10. The metal gasket according to claim 1 wherein surfaces of the metal base plate are covered with a rubber-like elastic member.

* * * * *